United States Patent
Jang et al.

(10) Patent No.: US 11,832,442 B2
(45) Date of Patent: Nov. 28, 2023

(54) SEMICONDUCTOR MEMORY DEVICE WITH BURIED CONTACTS AND A FENCE

(71) Applicant: SAMSUNG ELECTRONICS CO., LTD., Suwon-si (KR)

(72) Inventors: Hyeon Woo Jang, Suwon-si (KR); Soo Ho Shin, Hwaseong-si (KR); Dong Sik Park, Suwon-si (KR); Jong Min Lee, Hwaseong-si (KR); Ji Hoon Chang, Yongin-si (KR)

(73) Assignee: Samsung Electronics Co., Ltd.

( * ) Notice: Subject to any disclaimer, the term of this patent is extended or adjusted under 35 U.S.C. 154(b) by 57 days.

(21) Appl. No.: 17/493,671

(22) Filed: Oct. 4, 2021

(65) Prior Publication Data

US 2022/0262803 A1 Aug. 18, 2022

(30) Foreign Application Priority Data

Feb. 15, 2021 (KR) ........................ 10-2021-0019713

(51) Int. Cl.
*H10B 12/00* (2023.01)

(52) U.S. Cl.
CPC ....... *H10B 12/485* (2023.02); *H10B 12/0335* (2023.02); *H10B 12/053* (2023.02); *H10B 12/315* (2023.02); *H10B 12/34* (2023.02); *H10B 12/482* (2023.02); *H10B 12/30* (2023.02)

(58) Field of Classification Search
CPC ............... H01L 21/76; H01L 21/76801; H01L 21/76819; H01L 21/76224; H01L 21/76829; H01L 21/76831; H01L 21/76832; H01L 21/76834; H01L 21/76835; H01L 21/76837; H01L 29/4236; H10B 12/02; H10B 12/30; H10B 12/053; H10B 12/34
See application file for complete search history.

(56) References Cited

U.S. PATENT DOCUMENTS

| 5,864,156 A | 1/1999 | Juengling |
| 8,426,903 B2 | 4/2013 | Kujirai |
| 9,953,981 B2 | 4/2018 | Kim et al. |

(Continued)

FOREIGN PATENT DOCUMENTS

| CN | 110718550 A | 1/2020 |
| TW | I579970 B | 4/2017 |

OTHER PUBLICATIONS

Office Action for Taiwanese Patent Application No. 111100542 dated Feb. 8, 2023, 6 pages. (no translation).

*Primary Examiner* — Bradley Smith
*Assistant Examiner* — William Henry Anderson
(74) *Attorney, Agent, or Firm* — Myers Bigel, P.A.

(57) ABSTRACT

The present disclosure provides a semiconductor memory device with improved element performance and reliability. The semiconductor memory device comprises a substrate, a gate electrode extending in a first direction in the substrate, a plurality of buried contacts on the substrate, and a fence in a trench between adjacent ones of the buried contacts. The fence is on the gate electrode. The fence includes a spacer film on side walls of the trench and extending in a second direction intersecting the first direction, and a filling film in the trench and on the spacer film. An upper surface of the spacer film is lower than an upper surface of the filling film with respect to the substrate.

18 Claims, 23 Drawing Sheets

(56) References Cited

U.S. PATENT DOCUMENTS

| | | | |
|---|---|---|---|
| 10,559,570 B2* | 2/2020 | Nagai | H10B 12/0335 |
| 10,797,057 B2 | 10/2020 | Chang et al. | |
| 2002/0020917 A1* | 2/2002 | Hirota | H01L 23/5222 |
| | | | 257/758 |
| 2013/0264638 A1 | 10/2013 | Jang et al. | |
| 2015/0132942 A1* | 5/2015 | Kim | H01L 23/53295 |
| | | | 438/618 |
| 2015/0357336 A1 | 12/2015 | Sukekawa | |
| 2017/0330882 A1* | 11/2017 | Wang | H10B 12/0335 |
| 2018/0342521 A1* | 11/2018 | Son | H01L 21/0217 |
| 2019/0096890 A1 | 3/2019 | Lee et al. | |
| 2020/0091303 A1* | 3/2020 | Nam | H01L 29/42368 |
| 2021/0020781 A1 | 1/2021 | Cho et al. | |

\* cited by examiner

SEMICONDUCTOR MEMORY DEVICE WITH BURIED CONTACTS AND A FENCE

CROSS-REFERENCE TO RELATED APPLICATION

This application claims the benefit of Korean Patent Application No. 10-2021-0019713, filed on Feb. 15, 2021, in the Korean Intellectual Property Office, the disclosure of which is incorporated herein in its entirety by reference.

BACKGROUND

The present disclosure relates to a semiconductor memory device.

As semiconductor elements become increasingly highly integrated, individual circuit patterns become finer to implement more semiconductor elements in the same area. That is, as the degree of integration of the semiconductor element increases, the design rules of the components of the semiconductor element decrease.

In highly scaled semiconductor elements, the process of forming a plurality of buried contacts (BC) and a fence interposed between them may become increasingly complicated and difficult.

SUMMARY

Aspects of the present disclosure provide a semiconductor memory device with improved element performance and reliability.

However, aspects of the present disclosure are not restricted to the one set forth herein. The above and other aspects of the present disclosure will become more apparent to one of ordinary skill in the art to which the present disclosure pertains by referencing the detailed description of the present disclosure given below.

According to some embodiments of the present disclosure, there is provided a semiconductor memory device that includes a substrate, a gate electrode extending in a first direction in the substrate, a plurality of buried contacts on the substrate, a trench between adjacent ones of the buried contacts and a fence in the trench. The fence is on the gate electrode. The fence includes a spacer film on side walls of the trench and extending in a second direction intersecting the first direction, and a filling film in the trench and on the spacer film. An upper surface of the spacer film is lower than an upper surface of the filling film with respect to the substrate.

According to some embodiments of the present disclosure, there is provided a semiconductor memory device that includes a substrate, a gate electrode extending in a first direction in the substrate, a plurality of buried contacts on the substrate, and a fence in a trench between adjacent ones of the buried contacts. The fence is on the gate electrode. The fence includes a spacer film on side walls of the trench and extending in a second direction intersecting the first direction, and a filling film in the trench and on the spacer film. The filling film includes a first portion having a first width in a third direction intersecting the first direction and the second direction, and a second portion having a second width in the third direction on the first portion. The second width is greater than the first width, and the second portion of the filling film at least partially overlaps the spacer film in the second direction.

According to some embodiments of the present disclosure, there is provided a semiconductor memory device that includes a substrate, a gate structure which includes a gate electrode extending in a first direction, and a gate capping pattern on the gate electrode. The gate structure extends in the substrate. The semiconductor memory device includes a plurality of buried contacts on the substrate, and a fence in a trench between adjacent ones of the plurality of buried contacts. The fence is on the gate electrode. A bottom surface of the trench is defined by a top surface of the gate capping pattern. The fence includes a pair of spacer films on respective side walls of the trench and extending in a second direction intersecting the first direction, and a filling film in the trench and on the pair of spacer films. The filling film includes a first portion having a first width in a third direction intersecting the first direction and the second direction, and a second portion having a second width in the third direction on the first portion. The second portion is on the first portion and the second width is greater than the first width. An upper surface of one of the pair of spacer films is lower than an upper surface of the second portion of the filling film with respect to the substrate. The pair of spacer films are separated from one another along the bottom surface of the trench.

BRIEF DESCRIPTION OF THE DRAWINGS

These and/or other aspects will become apparent and more readily appreciated from the following description of the embodiments, taken in conjunction with the accompanying drawings in which.

DETAILED DESCRIPTION

Hereinafter, a semiconductor memory device according to some embodiments will be described referring to FIGS. 1 to 3.

Figure 1:
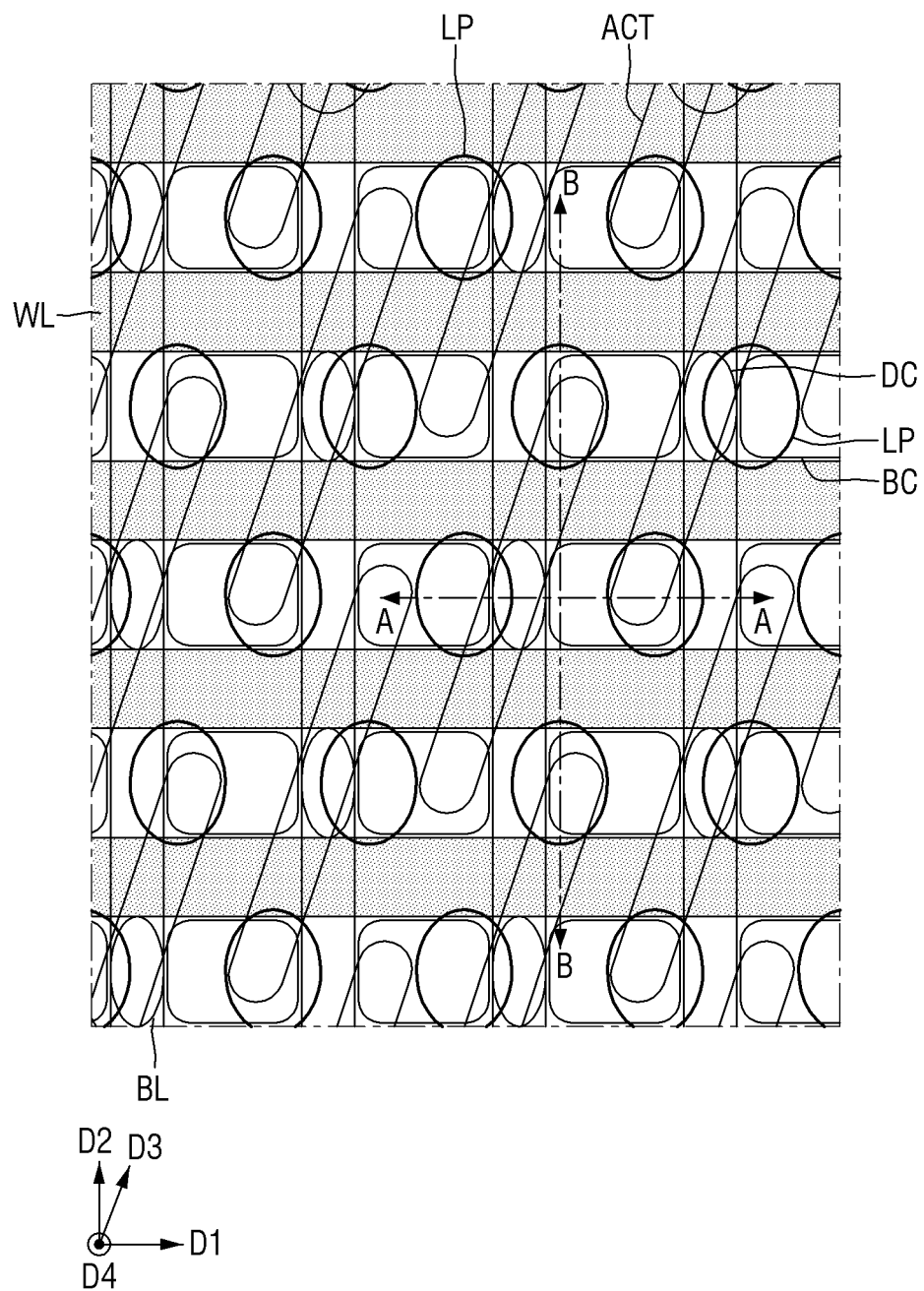
FIG. 1 is a layout diagram for explaining the semiconductor memory device according to some embodiments.

FIG. 1 is an exemplary layout diagram for explaining the semiconductor memory device according to some embodiments. FIG. 2 is a cross-sectional view taken along A-A of FIG. 1. FIG. 3 is a cross-sectional view taken along B-B of FIG. 1.

In the drawings relating to the semiconductor memory device according to some embodiments, although a DRAM (Dynamic Random Access Memory) is shown as an example, the embodiments are not limited thereto.

Figure 2:
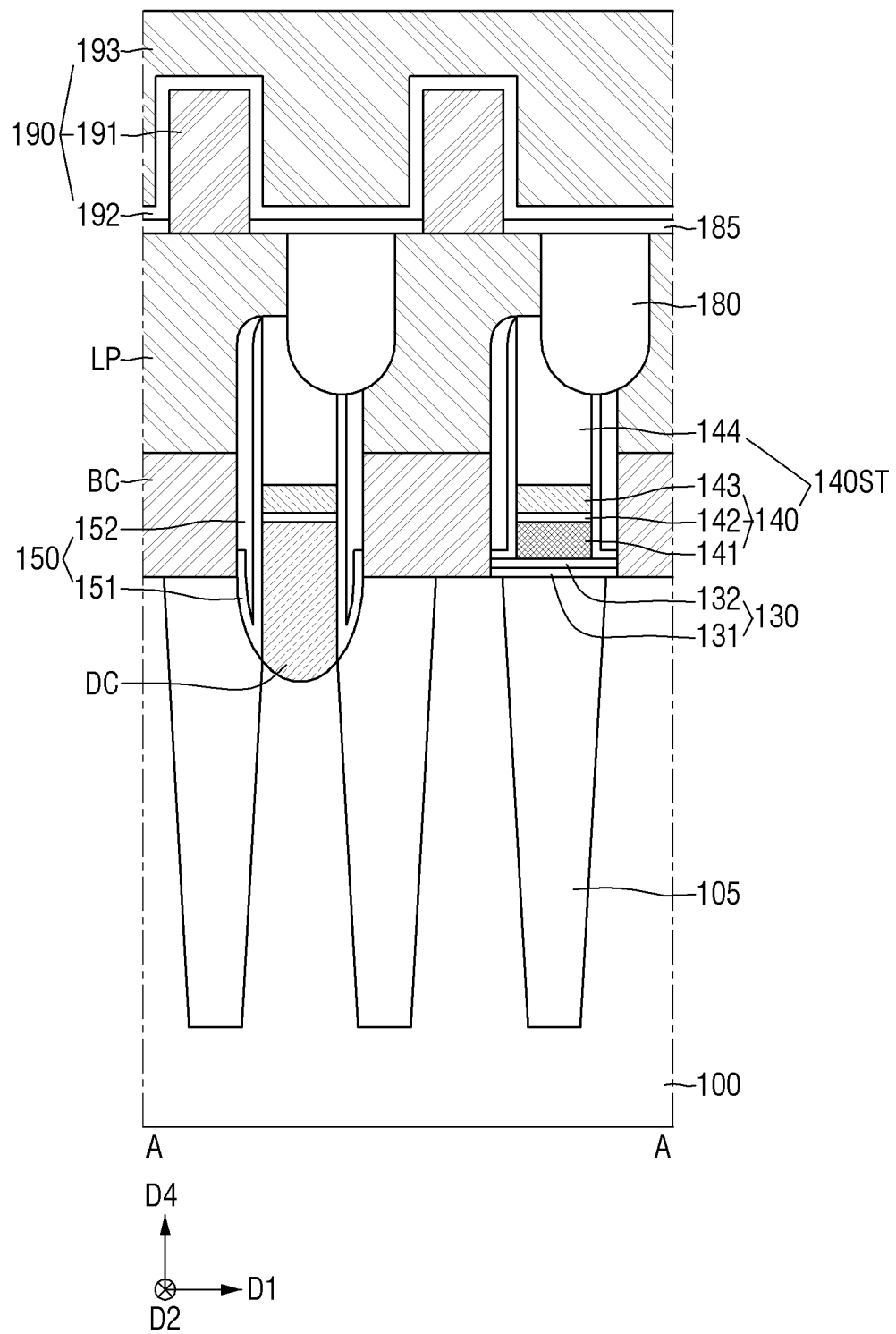
FIG. 2 is a cross-sectional view taken along A-A of FIG. 1.
Figure 3:
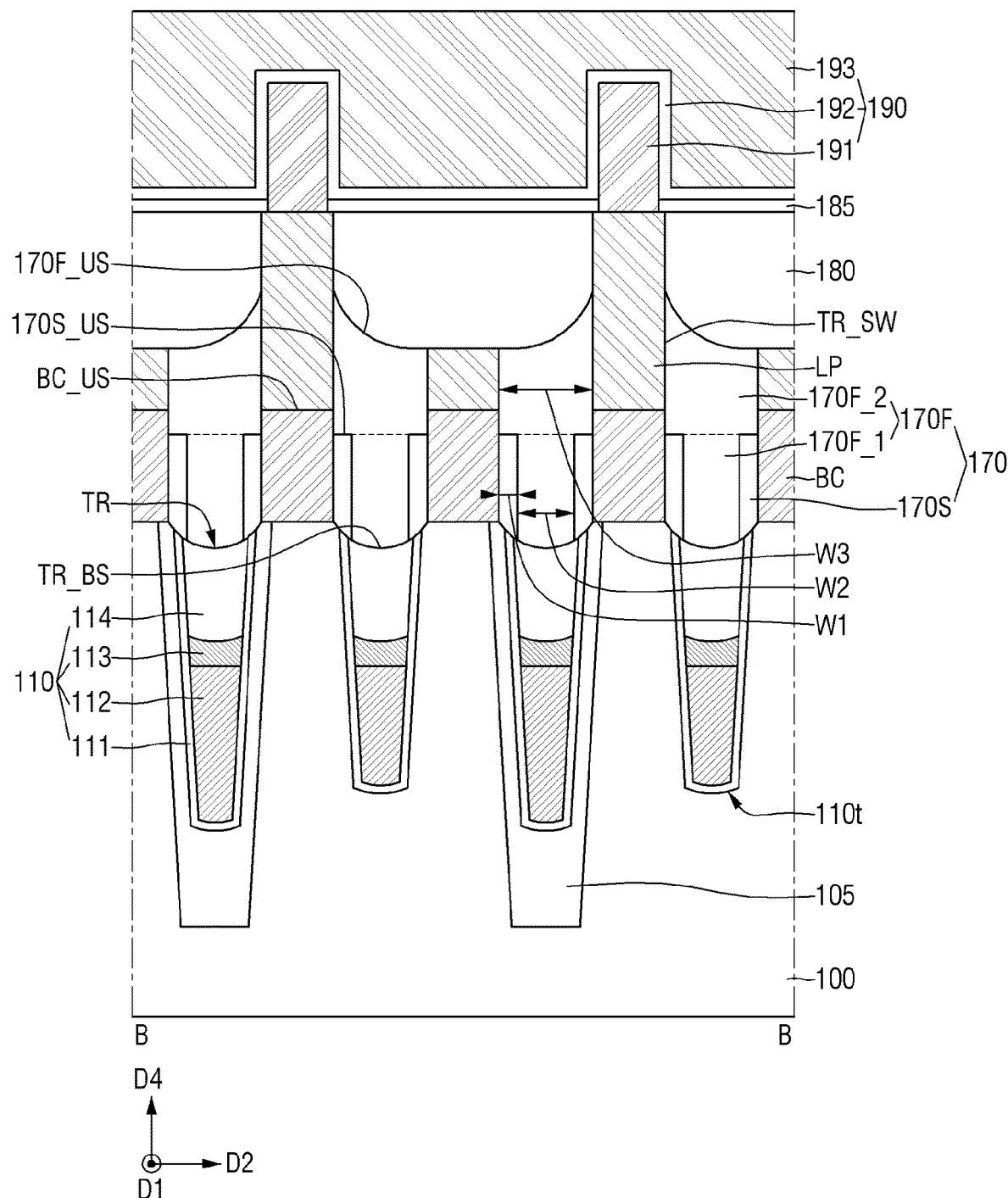
FIG. 3 is a cross-sectional view taken along B-B of FIG. 1.

Referring to FIGS. 1 to 3, the semiconductor memory device according to some embodiments includes a substrate 100, an element separation film 105, a bit line BL, a word line WL, a direct contact DC, a fence 170, a buried contact BC, a landing pad LP, an interlayer insulating film 180, and a capacitor 190.

The substrate 100 may be bulk silicon or SOI (silicon-on-insulator). In contrast, the substrate 100 may be a silicon substrate, or may include other materials, but are not limited to, for example, silicon germanium, SGOI (silicon germanium on insulator), indium antimonide, lead tellurium compounds, indium arsenide, phosphide indium, gallium arsenide or gallium antimonide. In the following description, the substrate 100 will be described as a silicon substrate.

The substrate 100 may include a plurality of active regions ACT. The active regions ACT may be defined by an element separation film 105 formed inside the substrate 100. With the decrease in design rules of the semiconductor memory device, the active region ACT may be placed in the form of a bar of a diagonal line (or an oblique line), as shown. For example, the active region ACT may extend in a third direction D3.

The active region ACT may be formed in the form of the bar extending in any third direction D3 other than a first direction D1 and a second direction D2 in a plane in which the first direction D1 and the second direction D2 extend. Further, the active region ACT may be in the form of a plurality of bars extending in directions parallel to each other. Further, the center of one active region ACT among the plurality of active regions ACT may be placed to be adjacent to a distal end portion of the other active region ACT. The active region ACT includes impurities, and may form source and drain regions.

A plurality of gate electrodes 112 extending in the first direction D1 may be placed across the active region ACT. The plurality of gate electrodes 112 may extend parallel to each other. The plurality of gate electrodes 112 may be, for example, a plurality of word lines WL. The plurality of word lines WL may be placed at equal intervals. The plurality of word lines may be spaced apart from each other in the second direction D2. A width of the word line WL or an interval between the word lines WL may be determined depending on design rules.

A plurality of bit lines BL extending in the second direction D2 intersecting the word line WL may be placed on the word line WL. The plurality of bit lines BL may extend parallel to each other. The plurality of bit lines BL may be spaced apart from each other in the first direction D1. The bit lines BL may be at equal intervals between one another. A width of the bit line BL or an interval between the bit lines BL may be determined depending on design rules.

The semiconductor memory device according to some embodiments may include various contact arrangements formed on the active region ACT. Various contact arrangements may include, for example, a direct contact DC, a buried contact BC, and/or a landing pad LP.

Here, the direct contact DC may mean a contact that electrically connects the active region ACT to the bit line BL. The buried contact BC may mean a contact that connects the active region ACT to a lower electrode 191 of the capacitor 190. In view of the placement structure, a contact area between the buried contact BC and the active region ACT may be small. Accordingly, a conductive landing pad LP may be introduced to increase the contact area with the active region ACT and increase the contact area with the lower electrode 191 of the capacitor 190.

The landing pad LP may be placed between the active region ACT and the buried contact BC, and may be placed between the buried contact BC and the lower electrode 191 of the capacitor 190. In the semiconductor memory device according to some embodiments, the landing pad LP may be placed between the buried contact BC and the lower electrode 191 of the capacitor 190. By increasing the contact area through introduction of the landing pad LP, the contact area between the active region ACT and the lower electrode 191 of the capacitor 190 may be reduced.

The direct contact DC may be connected to the substrate 100. As the buried contacts BC are placed at both distal end portions of the active region ACT, the landing pad LP may be placed to partially overlap the buried contact BC to be adjacent to both distal ends of the active region ACT. In other words, the buried contact BC may be formed to overlap the active region ACT and the element separation film 105 between adjacent word lines WL and/or between the adjacent bit lines BL.

The word line WL may be formed by a structure buried inside the substrate 100. The word line WL may be placed across the active region ACT between the direct contacts DC or between the buried contacts BC. As shown, two word lines WL may be placed to cross one active region ACT. As the active region ACT extends along the third direction D3, the word line WL may have an angle of less than 90 degrees with the active region ACT.

The direct contact DC and the buried contact BC may be placed symmetrically. Therefore, the direct contact DC and the buried contact BC may be placed on a straight line along the first direction D1 and the second direction D2. On the other hand, unlike the direct contact DC and the buried contact BC, the landing pad LP may be placed in the form of a zigzag in the second direction D2 along which the bit line BL extends. In addition, the landing pad LP may be placed to overlap the same side surface portion of each bit line BL in the first direction D1 along which the word line WL extends. For example, each of the landing pads LP of a first line overlaps a left side surface of the corresponding bit line BL, and each of the landing pads LP of a second line may overlap a right side surface of the corresponding bit line BL.

The semiconductor memory device according to some embodiments may include a plurality of gate structures 110, a plurality of bit line structures 140ST, a plurality of buried contacts BC, a direct contact DC, a plurality of fences 170, an interlayer insulating film 180, and a plurality of capacitors 190.

The element separation film 105 may be formed inside the substrate 100. The element separation film 105 may have a shallow trench isolation (STI) structure having excellent element separation characteristics. The element separation film 105 may define an active region ACT. The active region ACT defined by the element separation film 105 may have a long island shape including a minor axis and a major axis, as shown in FIG. 1. The active region ACT may have a form of an oblique line to have an angle of less than 90 degrees with respect to the word line WL formed inside the element separation film 105. Further, the active region ACT may have a form of an oblique line to have an angle of less than 90 degrees with respect to the bit line BL formed on the element separation film 105.

The element separation film 105 may include, but is not limited to, for example, at least one of a silicon oxide film, a silicon nitride film, and a silicon oxynitride film. In FIGS. 2 and 3, although the element separation film 105 is shown as being formed as a single insulating film, this is merely for convenience of explanation, and the embodiment is not limited thereto. Depending on the width of the element separation film 105, the element separation film 105 may be formed as a single insulating film or may be formed as a plurality of insulating films.

The gate structure 110 may be formed in the substrate 100 and the element separation film 105. The gate structure 110 may be formed across the element separation film 105 and the active region ACT defined by the element separation film 105. The gate structure 110 may extend in the first direction D1. The plurality of gate structures 110 may be spaced apart from each other in the second direction D2.

The gate structure 110 may include a gate insulating film 111, a gate electrode 112, a gate capping conductive film 113, and a gate capping pattern 114. Here, the gate electrode 112 may correspond to the word line WL. Unlike the shown case, the gate structure 110 may not include the gate capping conductive film 113.

The gate insulating film 111 may extend along side walls and a bottom surface of the gate trench 110t. The gate insulating film 111 may extend along a profile of at least a part of the gate trench 110t. The gate insulating film 111 may include, for example, at least one of silicon oxide, silicon nitride, silicon oxynitride or a high dielectric constant material having a higher dielectric constant than that of silicon oxide. The high dielectric constant material may include, for example, at least one of hafnium oxide, hafnium silicon oxide, hafnium aluminum oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, lead zinc niobate, and/or combinations thereof.

The gate electrode 112 may be formed on the gate insulating film 111. The gate electrode 112 may fill or at least partially fill a part of the gate trench 110t. The gate capping conductive film 113 may extend along the upper surface of the gate electrode 112.

The gate electrode 112 may include at least one of a metal, a metal alloy, a conductive metal nitride, a conductive metal carbonitride, a conductive metal carbide, a metal silicide, a doped semiconductor material, a conductive metal oxynitride, and/or a conductive metal oxide. The gate electrode 112 may include, but is not limited to, for example, at least one of TiN, TaC, TaN, TiSiN, TaSiN, TaTiN, TiAlN, TaAlN, WN, Ru, TiAl, TiAlC—N, TiAlC, TiC, TaCN, W, Al, Cu, Co, Ti, Ta, Ni, Pt, Ni—Pt, Nb, NbN, NbC, Mo, MoN, MoC, WC, Rh, Pd, Ir, Ag, Au, Zn, V, RuTiN, TiSi, TaSi, NiSi, CoSi, IrOx, RuOx and/or combinations thereof. The gate capping conductive film 113 may include, but is not limited to, for example, polysilicon or polysilicon germanium.

The gate capping pattern 114 may be placed on the gate electrode 112 and the gate capping conductive film 113. The gate capping pattern 114 may fill the gate trench 110t that remains after the gate electrode 112 and the gate capping conductive film 113 are formed. Although the gate insulating film 111 is shown to extend along the side walls of the gate capping pattern 114, the embodiment is not limited thereto. The gate capping pattern 114 may include, for example, at least one of silicon nitride (SiN), silicon oxynitride (SiON), silicon oxide ($SiO_2$), silicon carbonitride (SiCN), silicon oxycarbonitride (SiOCN), and/or combinations thereof.

Although it is not shown, an impurity doping region may be formed on at least one side of the gate structure 110. The impurity doping region may be a source/drain region of a transistor.

A bit line structure 140ST may include a conductive line 140 and a bit line capping pattern 144. The conductive line 140 may be formed on the substrate 100 and the element separation film 105 on which the gate structure 110 is formed. The conductive line 140 may intersect the element separation film 105 and the active region ACT defined by the element separation film 105. The conductive line 140 may be formed to intersect the gate structure 110. Here, the conductive line 140 may correspond to a bit line BL.

The conductive line 140 may be multi-films. The conductive line 140 may include, for example, a first conductive film 141, a second conductive film 142, and a third conductive film 143. The first to third conductive films 141, 142, and 143 may be sequentially stacked on the substrate 100 and the element separation film 105. Although the conductive line 140 is shown as a triple film, the embodiment is not limited thereto.

Each of the first to third conductive films 141, 142, and 143 may include, for example, at least one of an impurity-doped semiconductor material, a conductive silicide compound, a conductive metal nitride, a metal, and/or a metal alloy. For example, the first conductive film 141 includes a doped semiconductor material, the second conductive film 142 includes at least one of a conductive silicide compound and a conductive metal nitride, and the third conductive film 143 may include at least one of metal and metal alloy. However, the embodiment is not limited thereto.

A direct contact DC may be formed between the conductive line 140 and the substrate 100. That is, the conductive line 140 may be formed on the direct contact DC. For example, the direct contact DC may be formed at a point where the conductive line 140 intersects a central portion of the active region ACT having a long island shape.

The direct contact DC may electrically connect the conductive line 140 and the substrate 100. The direct current DC may include, for example, at least one of an impurity-doped semiconductor material, a conductive silicide compound, a conductive metal nitride, and a metal.

In a region that overlaps an upper surface of the direct contact DC in FIG. 2, the conductive line 140 may include a second conductive film 142 and a third conductive film 143. In a region that does not overlap the upper surface of the direct contact DC, the conductive lines 140 may include first to third conductive films 141, 142, and 143.

The bit line capping pattern 144 may be placed on the conductive line 140. The bit line capping pattern 144 may extend in the second direction D2 along the upper surface of the conductive line 140. At this time, the bit line capping pattern 144 may include, for example, at least one of silicon nitride film, silicon oxynitride, silicon carbonitride and/or silicon oxycarbonitride. In the semiconductor memory device according to some embodiments, the bit line capping pattern 144 may include, for example, a silicon nitride film. Although the bit line capping pattern 144 is shown as a single film, the embodiment is not limited thereto.

The insulating film 130 may be formed on the substrate 100 and the element separation film 105. More specifically, the insulating film 130 may be formed on the substrate 100 and the element separation film 105 on which the direct contact DC is not formed. The insulating film 130 may be formed between the substrate 100 and the conductive line 140, and between the element separation film 105 and the conductive line 140.

Although the insulating film 130 may be a single film, as shown, the insulating film 130 may be multi-films including the first insulating film 131 and the second insulating film 132. For example, although the first insulating film 131 may include a silicon oxide film, and the second insulating film 132 may include a silicon nitride film, the embodiment is not limited thereto.

A bit line spacer 150 may be placed on the side walls of the conductive line 140 and the bit line capping pattern 144. The bit line spacer 150 may be formed on the substrate 100 and the element separation film 105 at a portion of the conductive line 140 on which the direct contact DC is formed. The bit line spacer 150 may be placed on the side walls of the conductive line 140, the bit line capping pattern 144 and the direct contact DC. The bit line spacer 150 may extend in the second direction D2 on the side walls of the conductive line 140 and the bit line capping pattern 144.

Although the bit line spacer 150 may be a single film, as shown in FIG. 2, the bit line spacer 150 may include multi-films including the first bit line spacer 151 and the second bit line spacer 152. For example, each of the first and second bit line spacers 151 and 152 may include, but is not limited to, one of a silicon oxide film, a silicon nitride film, a silicon oxynitride film (SiON), a silicon oxycarbonitride film (SiOCN), air, and/or combinations thereof.

The buried contact BC may be placed between the conductive lines 140 adjacent to each other in the first direction D1. The buried contact BC may be placed between the fences 170 adjacent to each other in the second direction D2. The buried contact BC may overlap the substrate 100 and/or the element separation film 105 between the adjacent conductive lines 140.

The buried contact BC may include, for example, at least one of an impurity-doped semiconductor material, a conductive silicide compound, a conductive metal nitride, and a metal. Accordingly, the buried contact BC may be electrically connected to the active region ACT. The buried contact BC may include, for example, polysilicon.

The fence 170 may be placed on the substrate 100 and the element separation film 105. The fence 170 may be formed to overlap the gate structure 110 formed in the substrate 100 and the element separation film 105 in a fourth direction D4. The fourth direction D4 may intersect the first direction D1 and the second direction D2. For example, the fourth direction D4 may be perpendicular to the first direction D1 and the second direction D2.

The fence 170 may be placed on the gate electrode 112. The fence 170 may be placed between the bit line structures 140ST extending in the second direction D2. The fence 170 may be placed between adjacent buried contacts BC. The fence 170 may at least partially fill or completely fill the trench TR defined between the adjacent buried contacts BC.

The fence 170 may include a spacer film 170S placed on a part of side walls TR_SW of the trench TR, and a filling film 170F placed on the spacer film 170S. The side walls TR_SW of the trench TR may be defined by the side walls of the buried contact BC and the side walls of the landing pad LP. A bottom surface TR_BS of the trench TR may be defined by the gate capping pattern 114. In FIG. 3, although the bottom surface TR_BS of the trench TR is shown as a curved surface, the shape is not limited thereto, and the bottom surface TR_BS of the trench TR may be a planar flat surface.

The spacer film 170S extends in the fourth direction D4 along the side walls TR_SW of the trench TR. The spacer film 170S may be in contact with at least a part of the side walls of the buried contact BC. In some embodiments, an upper surface 170S_US of the spacer film 170S is lower than an upper surface BC_US of the buried contact BC. That is to say, a height from the upper surface of the substrate 100 to the upper surface 170S_US of the spacer film 170S is smaller than a height from the upper surface of the substrate 100 to the upper surface BC_US of the buried contact BC. Accordingly, the spacer film 170S is not in contact with the side walls of the landing pad LP. However, the technical idea of the present disclosure is not limited thereto.

The spacer film 170S may be in contact with a part of the bottom surface TR_BS of the trench TR. The spacer film 170S does not extend along the bottom surface TR_BS of the trench TR. That is, the pair of spacer films 170S may be placed on a part of both side walls TR_SW of the trench TR, and each of the pair of spacer films 170S may be spaced apart from each other in the second direction D2. Accordingly, the spacer film 170S may not overlap at least a part of the gate electrode 112 in the fourth direction D4. However, the technical idea of the present disclosure is not limited thereto.

The spacer film 170S may have a first width W1 in the second direction D2. The first width W1 may be, for example, 0.5 nm to 10 nm. Although the spacer film 170S is illustrated as having a uniform width, the first width W1 may refer to a widest width of spacer film 170S. However, the technical idea of the present disclosure is not limited thereto.

The spacer film 170S may overlap at least a part of the filling film 170F in the fourth direction D4. The upper surface 170S_US of the spacer film 170S may be lower than the upper surface 170F_US of the filling film 170F. That is to say, the height from the upper surface of the substrate 100 to the upper surface 170S_US of the spacer film 170S is smaller than the height from the upper surface of the substrate 100 to the upper surface 170F_US of the filling film 170F.

The spacer film 170S may include a low dielectric constant material. Although the spacer film 170S may include, for example, at least one of silicon oxide ($SiO_2$) or a low dielectric constant material having a dielectric constant lower than that of silicon nitride, the technical idea of the present disclosure is not limited thereto.

The filling film 170F may be placed on the spacer film 170S. The filling film 170F may fill the trench TR that remains after the spacer film 170S is formed.

The filling film 170F may include a first portion 170F_1, and a second portion 170_2 on the first portion 170F_1. The first portion 170F_1 of the filling film 170F may extend from the bottom surface TR_BS of the trench TR to the upper surface 170S_US of the spacer film 170S. The second portion 170F_2 of the filling film 170F may extend from the upper surface 170S_US of the spacer film 170S to the lower surface of the interlayer insulating film 180. The second portion 170F_2 of the filling film 170F may fill the trench TR that remains after the spacer film 170S and the first portion 170F_1 of the filling film 170F are formed.

The first portion 170F_1 of the filling film 170F may overlap at least a part of the spacer film 170S in the second direction D2. In some embodiments, the first portion 170F_1 of the filling film 170F may not overlap the spacer film 170S in the fourth direction D4. The first portion 170F_1 of the filling film 170F may have a second width W2 in the second direction D2.

At least a part of the second portion 170F_2 of the filling film 170F may overlap the spacer film 170S in the fourth direction D4. At least a part of the second portion 170F_2 of the filling film 170F may not overlap the first portion 170F_1 of the filling film 170F in the fourth direction D4.

The second portion 170F_2 of the filling film 170F may have a third width W3 in the second direction D2. The third width W3 of the second portion 170F_2 of the filling film 170F may be the same as the width of the trench TR in the second direction D2. That is, the trench TR may have the third width W3 in the second direction D2.

At the same position, the third width W3 may be the same as an added value of the first width W1, the second width W2, and the first width W1. That is, at the same position, the width of the trench TR in the second direction D2 may be the same as an added value of the width of the pair of spacer films 170S and the width of the first portion 170F_1 of the filling film 170F.

As shown in FIG. 3, a ratio of the third width W3 of the trench TR in the second direction D2 to the second width W2 of the first portion 170F_1 of the filling film 170F in the second direction D2 may be 0.5 or more. However, the technical idea of the present disclosure is not limited thereto.

The upper surface 170S_US of the spacer film 170S may be lower than the upper surface BC_US of the buried contact BC. Accordingly, at least a part of the filling film 170F may be in contact with the buried contact BC.

The filling film 170F may include a material having a higher dielectric constant than that of the spacer film 170S. Although the filling film 170F may include, for example, at least one of silicon nitride, silicon oxynitride or a high dielectric constant material having a higher dielectric constant than that of silicon oxide, the technical idea of the present disclosure is not limited thereto.

As the semiconductor memory devices are highly integrated, influences of parasitic capacitance and leakage current gradually increase. For example, as the gap between bit lines of DRAM (Dynamic Random Access Memory) becomes narrow, the parasitic capacitance between the bit lines and between the bit line and the buried contact may increase.

The semiconductor memory device according to some embodiments may minimize parasitic capacitance, using silicon oxide. Since silicon oxide has a lower dielectric constant than that of silicon nitride, the semiconductor memory device according to some embodiments may effectively reduce the parasitic capacitance.

For example, a semiconductor memory device in which a fence is formed of silicon oxide may effectively reduce parasitic capacitance, as compared with a semiconductor memory device in which a fence is formed of silicon nitride.

In some embodiments, because the spacer film 170S is formed of silicon oxide, parasitic capacitance may be effectively reduced, as compared with the semiconductor memory device in which the fence 170 is formed of silicon nitride.

Since the semiconductor memory device according to some embodiments may effectively reduce the parasitic capacitance, high integration of the semiconductor memory device may be realized within the range of the permitted parasitic capacitance.

Further, in the semiconductor memory device according to some embodiments, since the spacer film 170S of the fence 170 is formed of silicon oxide, even when the spacer film 170S comes into contact with the buried contact BC, leakage current may be minimized. This is because the silicon oxide may effectively prevent the leakage current due to an interfacial trap $N_{it}$ as compared with the silicon nitride.

The landing pad LPs may be formed on the buried contact BC. The landing pad LP may be electrically connected to the buried contact BC.

The landing pad LP may overlap a part of the upper surface of the bit line structure 140ST. The landing pad LP may include, for example, at least one of an impurity-doped semiconductor material, a conductive silicide compound, a conductive metal nitride, a conductive metal carbide, a metal, and a metal alloy.

The interlayer insulating film 180 may be formed on the landing pad LP and the bit line structure 140ST. For example, the interlayer insulating film 180 may be placed on the bit line capping pattern 144. The interlayer insulating film 180 may define a region of the landing pad LP that forms a plurality of isolated regions. Also, the interlayer insulating film 180 may not cover the upper surface of the landing pad LP.

The interlayer insulating film 180 may electrically separate a plurality of landing pads LP from each other, by including an insulating material. For example, the interlayer insulating film 180 may include at least one of a silicon oxide film, a silicon nitride film, a silicon oxynitride film, a silicon oxycarbonitride film, and a silicon carbonitride film.

An etching stop film 185 may be placed on the interlayer insulating film 180 and the landing pad LP. The etching stop film 185 may include, for example, at least one of a silicon nitride film, a silicon carbonitride film, a silicon boronitride film (SiBN), a silicon oxynitride film, and a silicon oxycarbide film.

A capacitor 190 may be placed on the landing pad LP. The capacitor 190 may be electrically connected to the landing pad LP. As a result, the capacitor 190 may be electrically connected to the source and drain regions connected to the buried contact BC. Accordingly, the capacitor 190 may store electric charges in the semiconductor memory device or the like.

A part of the capacitor 190 may be placed inside the etching stop film 185. The capacitor 190 includes a lower electrode 191, a capacitor dielectric film 192, and an upper electrode 193. The capacitor 190 may store electric charges in the capacitor dielectric film 192 due to a potential difference that occurs between the lower electrode 191 and the upper electrode 193.

The lower electrode 191 may be placed on the landing pad LP. Although the lower electrode 191 is shown to have a pillar shape, the shape is not limited thereto. The lower electrode 191 may, of course, have a cylinder shape. The capacitor dielectric film 192 is formed on the lower electrode 191. The capacitor dielectric film 192 may be formed along the profile of the lower electrode 191. The upper electrode 193 is formed on the capacitor dielectric film 192. The upper electrode 193 may wrap the outer side walls of the lower electrode 191.

In some embodiments, the capacitor dielectric film 192 may be placed in a portion that perpendicularly overlaps the upper electrode 193. In other embodiments, unlike the shown case, the capacitor dielectric film 192 may include a first portion that perpendicularly overlaps the upper electrode 193, and a second portion that does not perpendicularly overlap the upper electrode 193. That is, the second portion of the capacitor dielectric film 192 is a portion that is not covered with the upper electrode 193.

The lower electrode 191 may include, but is not limited thereto, for example, a doped semiconductor material, a conductive metal nitride (e.g., titanium nitride, tantalum nitride, niobium nitride or tungsten nitride, etc.), a metal (e.g., ruthenium, iridium, titanium or tantalum, etc.), and/or a conductive metal oxide (e.g., iridium oxide or niobium oxide, etc.).

The capacitor dielectric film 192 may include, but is not limited to, for example, at least one of silicon oxide, silicon nitride, silicon oxynitride, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, lead zinc niobate, and/or combination thereof.

In the semiconductor memory device according to some embodiments, the capacitor dielectric film 192 may include a stacked film structure in which zirconium oxide, aluminum oxide and zirconium oxide are sequentially stacked.

In the semiconductor memory device according to some embodiments, the capacitor dielectric film 192 may include a dielectric film containing hafnium (Hf). In the semiconductor memory device according to some embodiments, the capacitor dielectric film 192 may have a stacked film structure of a ferroelectric material film and a paraelectric material film.

The upper electrode 193 may include, but is not limited to, for example, at least one of a doped semiconductor material, a metal, a conductive metal nitride, and a metal silicide.

Figure 4:
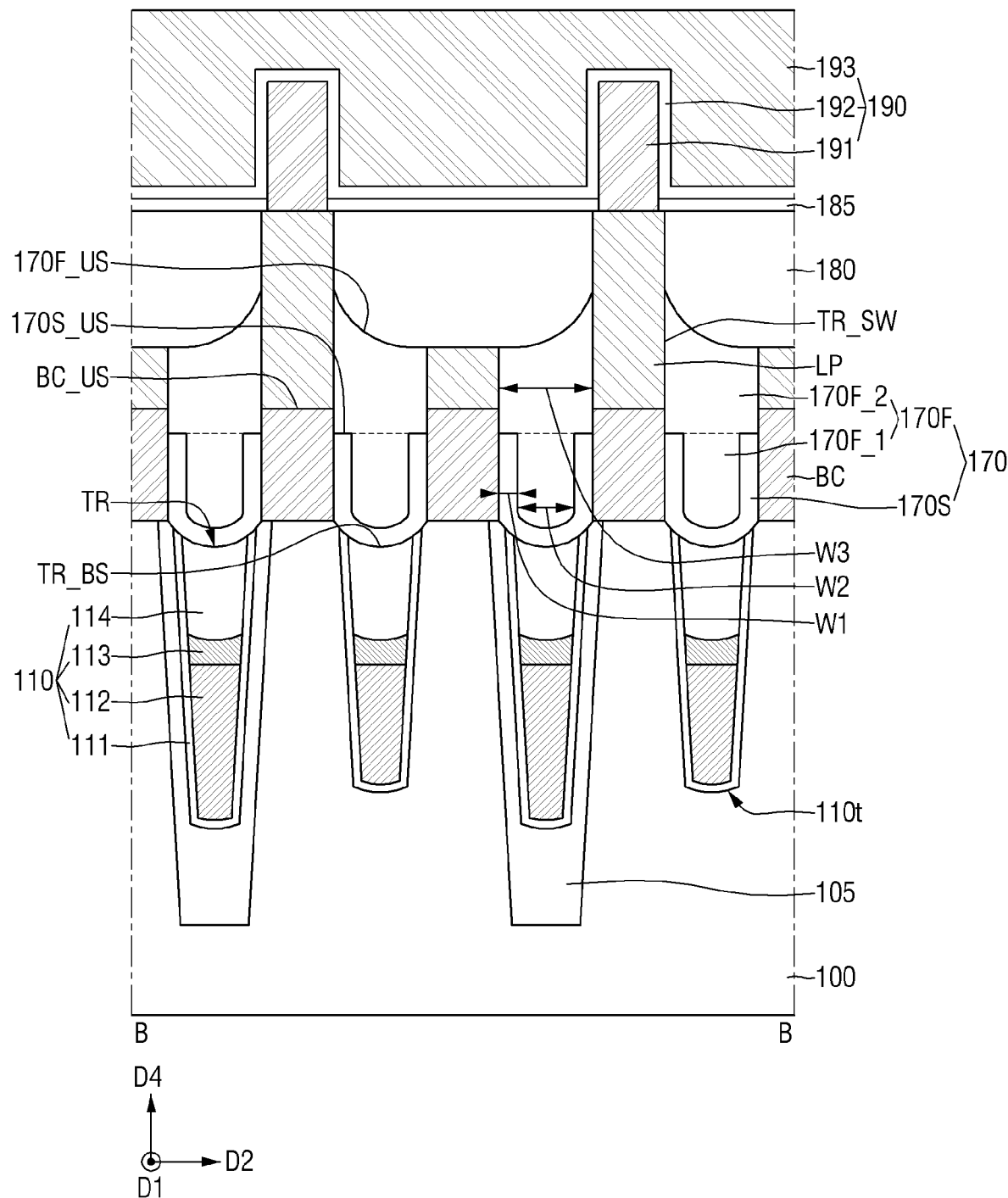
FIG. 4 is a diagram for explaining a semiconductor memory device according to some embodiments.

FIG. 4 is a diagram for explaining a semiconductor memory device according to some embodiments. For convenience of explanation, points different from those described in FIGS. 1 to 3 will be mainly described.

Referring to FIG. 4, the spacer film 170S may extend along the bottom surface TR_BS of the trench TR.

The spacer film 170S includes a vertical portion extending along both side walls TR_SW of the trench TR, and a horizontal portion extending along the bottom surface TR_BS of the trench TR. The horizontal portion of spacer film 170S connects the vertical portion of each spacer film 170S. That is, in some embodiments, the spacer film 170S may extend along the bottom surface TR_BS of the trench TR and a part of the side walls TR_SW of the trench TR.

Figure 5:
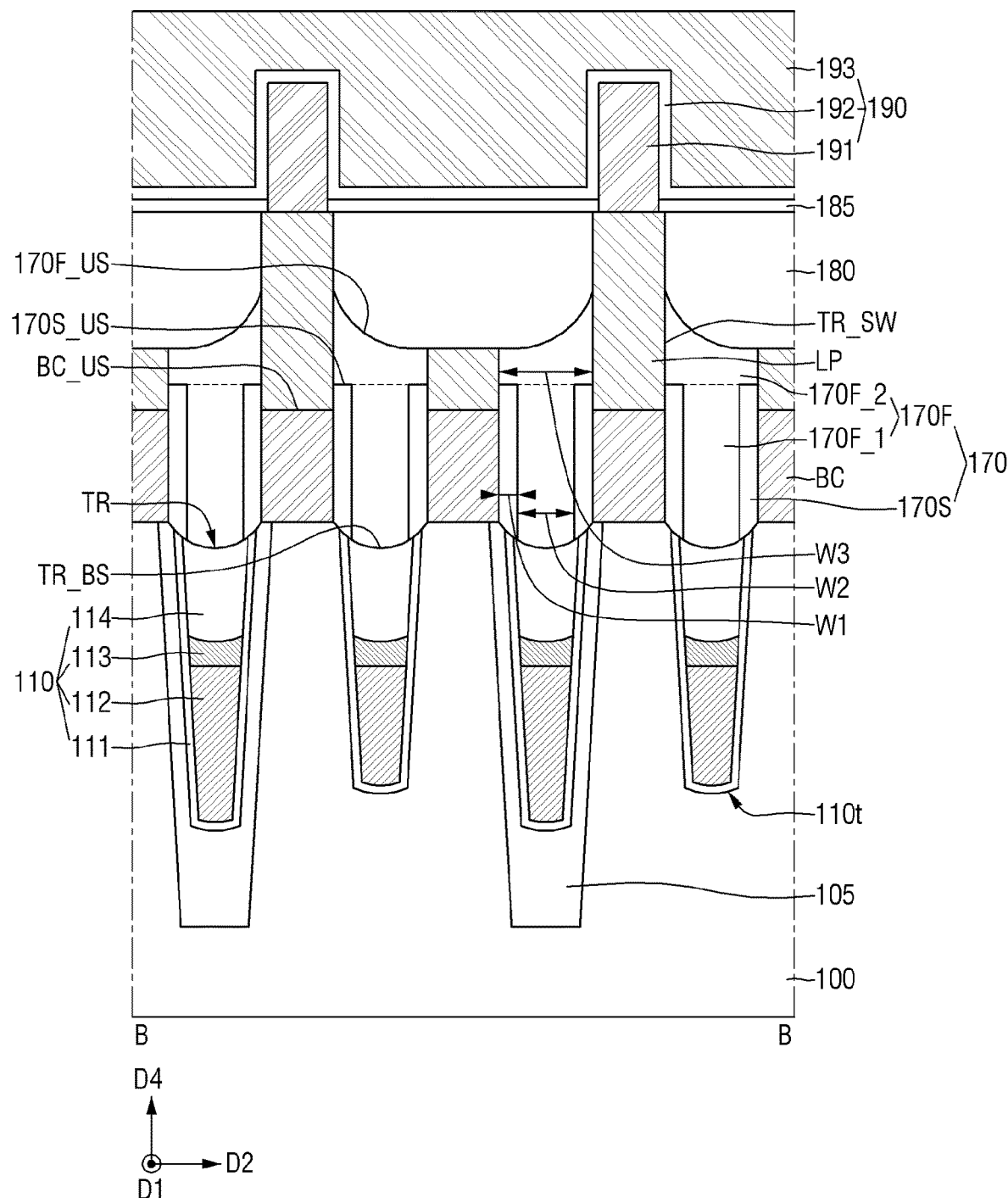
FIG. 5 is a diagram for explaining a semiconductor memory device according to some embodiments.

FIG. 5 is a diagram for explaining a semiconductor memory device according to some embodiments. For convenience of explanation, points different from those described in FIGS. 1 to 3 will be mainly described.

Referring to FIG. 5, the upper surface 170S_US of the spacer film 170S may be higher than the upper surface BC_US of the buried contact BC.

A height from the upper surface of the substrate 100 to the upper surface 170S_US of the spacer film 170S may be greater than a height from the upper surface of the substrate 100 to the upper surface BC_US of the buried contact BC. In the fabricating procedure of the spacer film 170S, the height of the upper surface 170S_US of the spacer film 170S may change depending on the degree to which the spacer film 170S is recessed.

Accordingly, the spacer film 170S may completely overlap the buried contact BC in the second direction D2. At least a part of the spacer film 170S may be in contact with the side walls of the landing pad LP. At least a part of the spacer film 170S may overlap the landing pad LP in the second direction D2.

Figure 6:
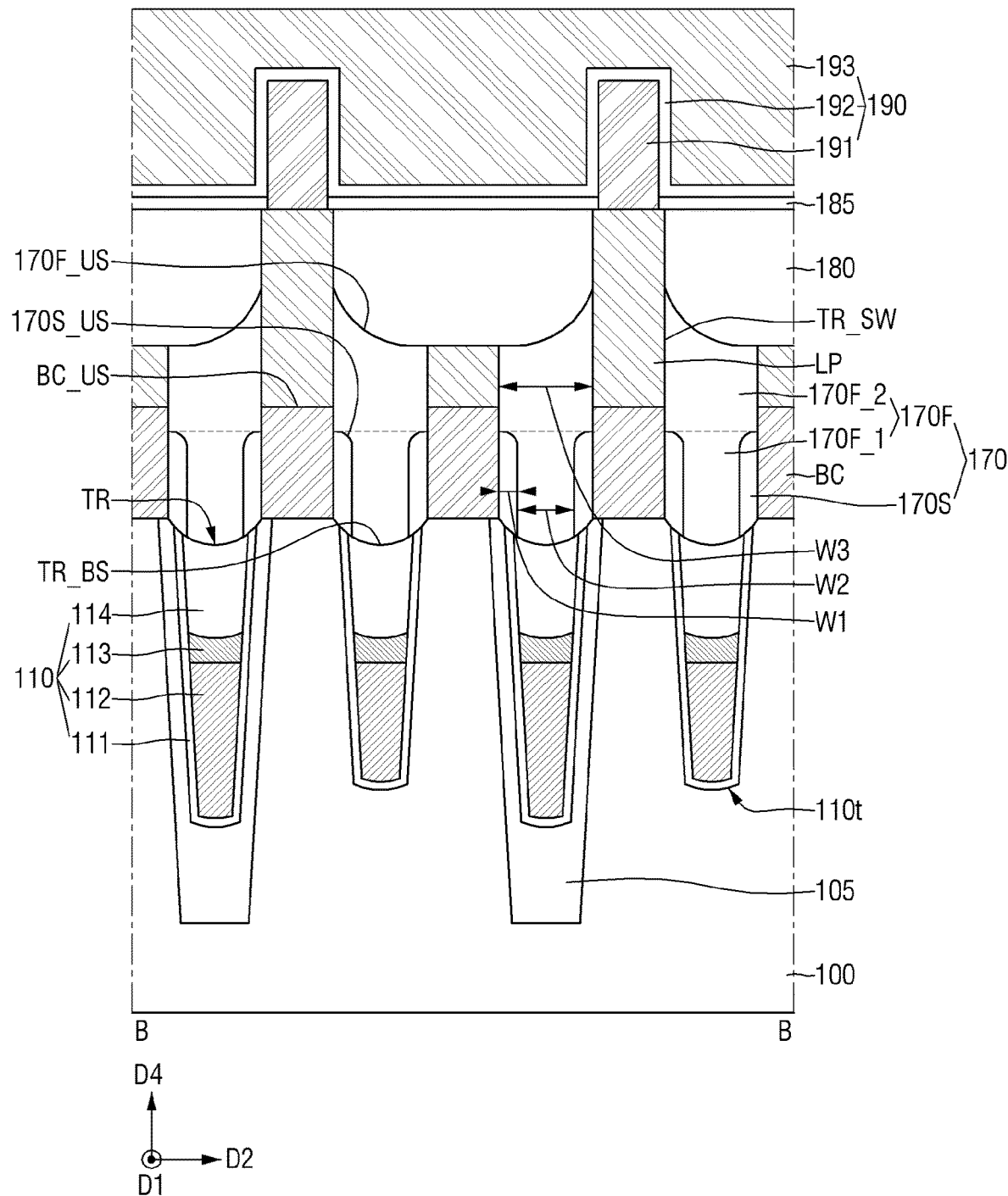
FIG. 6 is a diagram for explaining the semiconductor memory device according to some embodiments.

FIG. 6 is a diagram for explaining the semiconductor memory device according to some embodiments. For convenience of explanation, points different from those described in FIGS. 1 to 3 will be mainly described.

Referring to FIG. 6, the upper surface of the spacer film 170S may be a curved surface. On the side walls of the buried contact BC, the height from the upper surface of the substrate 100 to the upper surface 170S_US of the spacer film 170S may decrease toward the center of the trench TR.

In some embodiments, at a boundary between the second portion 170F_2 of the filling film 170F and the first portion 170F_1 of the filling film 170F, the width of the second portion 170F_2 of the filling film 170F in the second direction D2 may be the same as the width of the first portion 170F_1 of the filling film 170F in the second direction D2.

Figure 7:
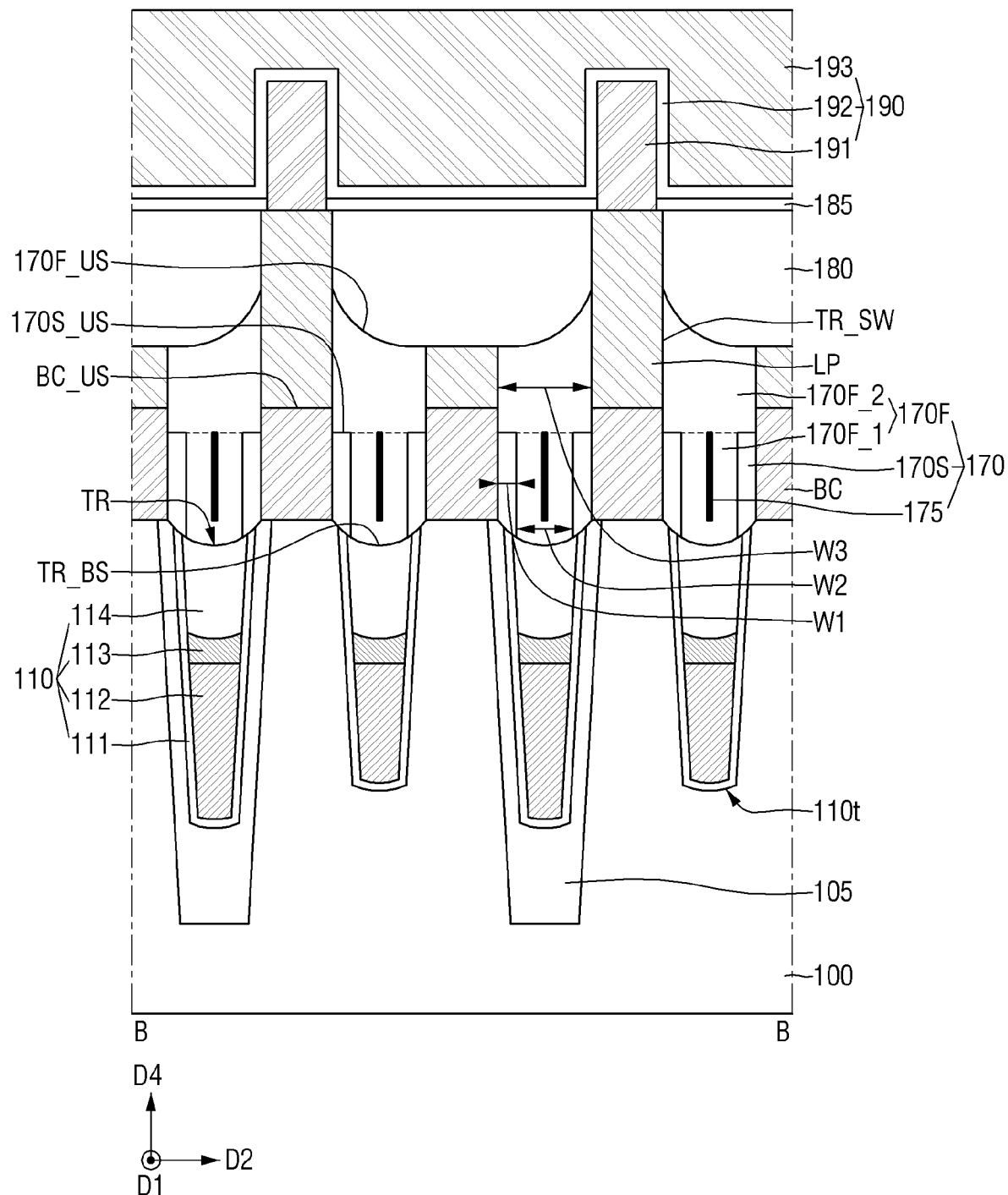
FIG. 7 is a diagram for explaining the semiconductor memory device according to some embodiments.

FIG. 7 is a diagram for explaining the semiconductor memory device according to some embodiments. For convenience of explanation, points different from those described in FIGS. 1 to 3 will be mainly described.

Referring to FIG. 7, the semiconductor memory device according to some embodiments may include a seam 175.

The seam 175 may be spaced apart from the spacer film 170S in the second direction D2. The seam 175 may be placed between a pair of spacer films 170S. The seam 175 may be placed inside the filling film 170F.

The seam 175 may be placed over the first portion 170F_1 and the second portion 170F_2 of the filling film 170F. An upper surface of the seam 175 may be higher than the upper surface 170S_US of the spacer film 170S. At least a part of the seam 175 may overlap the second portion 170F_2 of the filling film 170F in the second direction D2. At least a part of the seam 175 may overlap the first portion 170F_1 of the filling film 170F in the second direction D2.

A lower surface of the seam 175 may be higher than the bottom surface TR_BS of the trench TR. The seam 175 may be spaced from the bottom surface TR_BS of the trench TR in the fourth direction D4.

Figure 8:
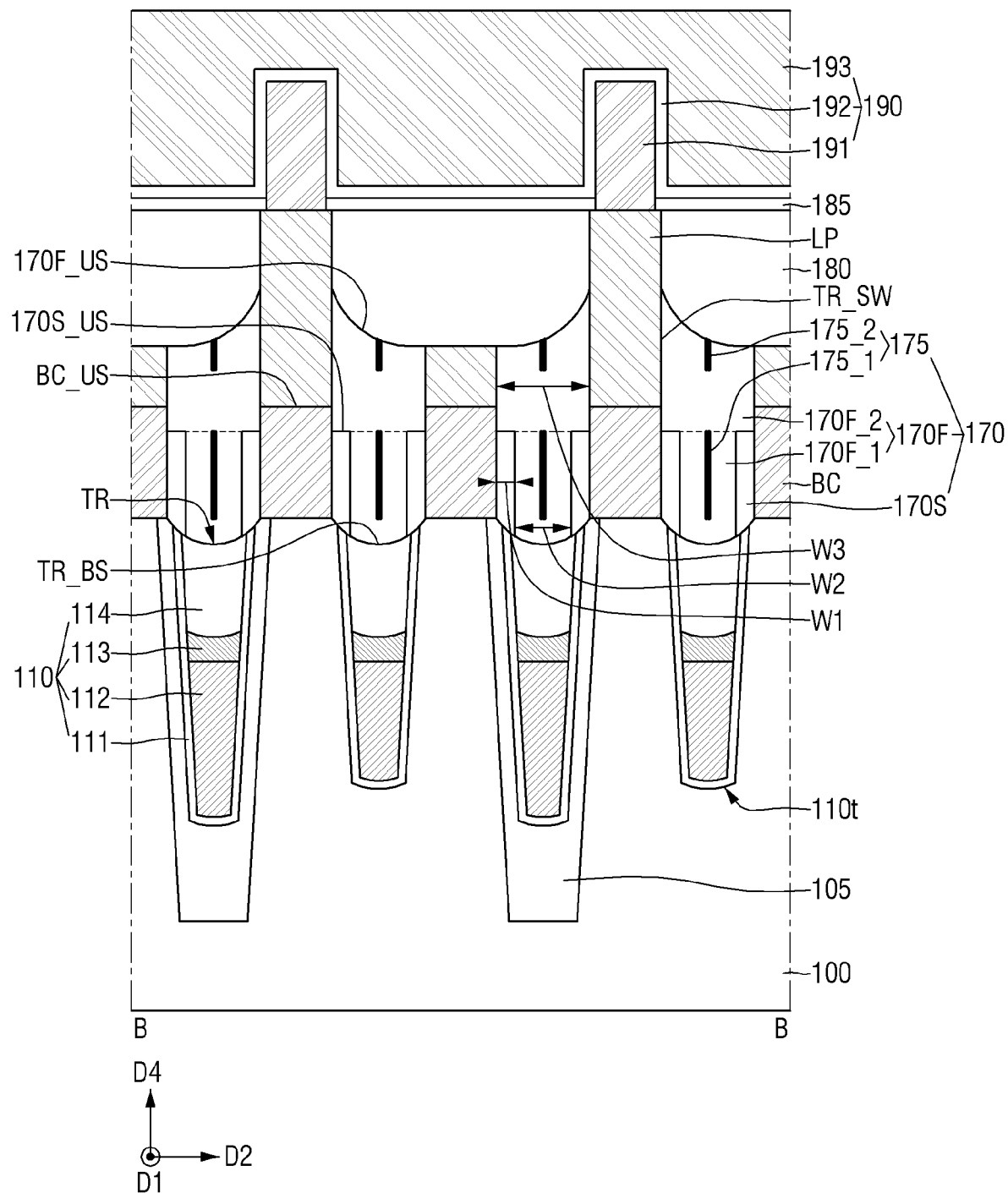
FIG. 8 is a diagram for explaining a semiconductor memory device according to some embodiments.

FIG. 8 is a diagram for explaining a semiconductor memory device according to some embodiments. For convenience of explanation, points different from those described in FIGS. 1 to 3 will be mainly described.

Referring to FIG. 8, the seam 175 may include a lower seam 175_1, and an upper seam 175_2 on the lower seam 175_1.

The lower seam 175_1 may be spaced apart from the spacer film 170S in the second direction D2. The lower seam 175_1 may be placed between a pair of spacer films 170S. The lower seam 175_1 may be placed over the first portion 170F_1 and the second portion 170F_2 of the filling film 170F. That is, the upper surface of the lower seam 175_1 may be higher than the upper surface of the first portion 170F_1 of the filling film 170F.

A lower surface of the lower seam 175_1 may be higher than the bottom surface TR_BS of the trench TR. The lower seam 175_1 may be spaced apart from the bottom surface TR_BS of the trench TR in the fourth direction D4.

The upper seam 175_2 may be placed on the lower seam 175_1. The upper seam 175_2 may be spaced apart from the lower seam 175_1 in the fourth direction D4. The upper seam 175_2 may not be spaced apart from the lower surface of the interlayer insulating film 180. However, the technical idea of the present disclosure is not limited thereto.

Figure 9:
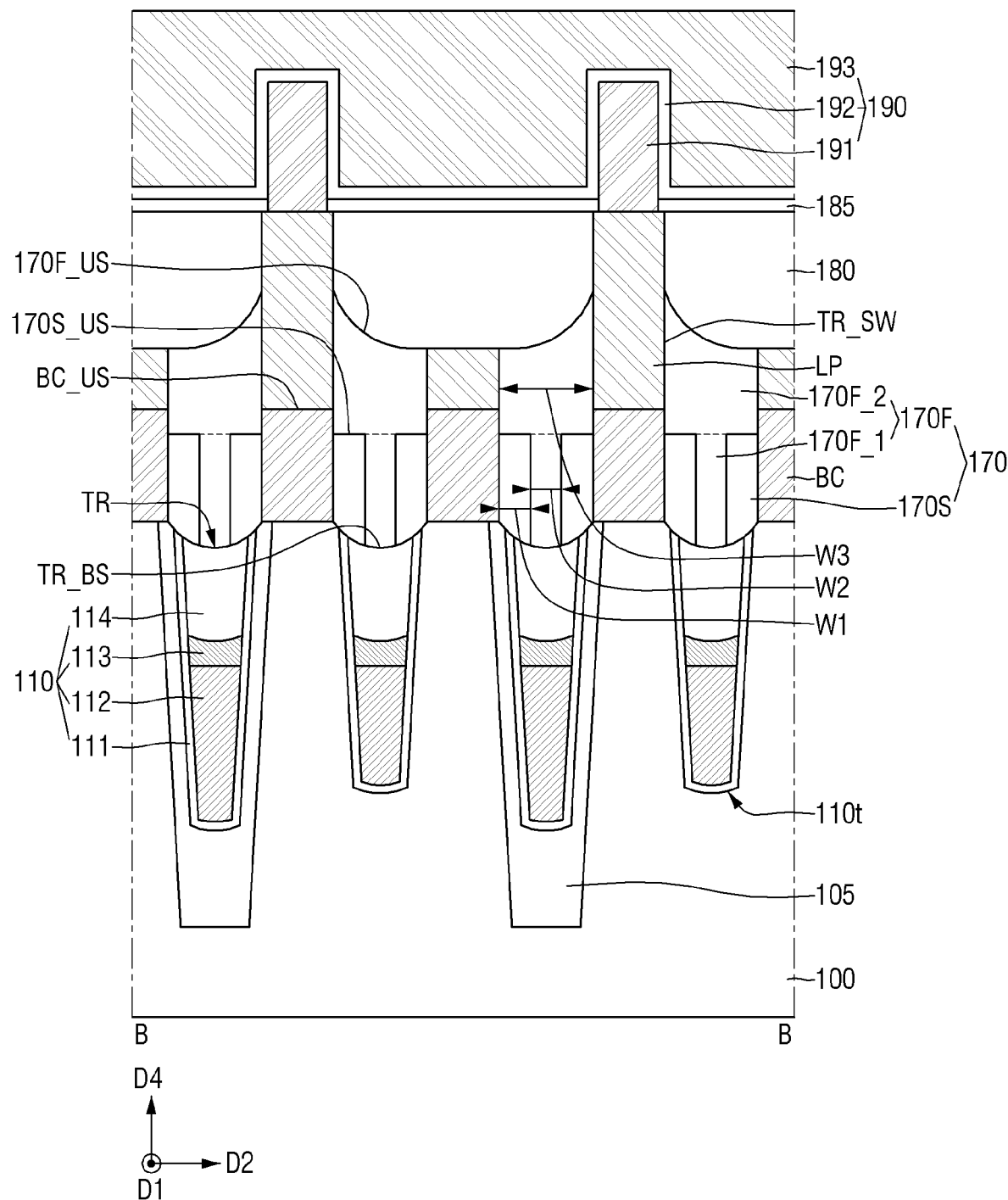
FIG. 9 is a diagram for explaining a semiconductor memory device according to some embodiments.

FIG. 9 is a diagram for explaining a semiconductor memory device according to some embodiments. For convenience of explanation, points different from those described in FIGS. 1 to 3 will be mainly described.

Referring to FIG. 9, in the semiconductor memory device according to some embodiments, a ratio of the width of the first portion 170F_1 of the filling film 170F in the second direction D2 to the width of the trench TR in the second direction D2 may be greater than 0.5.

The spacer film 170S may have a first width W1 in the second direction D2. The first portion 170F_1 of the filling film 170F may have a second width W2 in the second direction D2. The trench TR may have a third width W3 in the second direction D2.

A ratio of the third width W3 of the trench TR in the second direction D2 to the second width W2 of the first portion 170F_1 of the filling film 170F in the second direction D2 may be 0.5 or more. However, the technical idea of the present disclosure is not limited thereto.

FIGS. 10 to 23 are intermediate stage diagrams for explaining a method for fabricating the semiconductor memory device according to some embodiments. The method for fabricating the semiconductor memory device according to some embodiments will be described referring to FIGS. 10 to 23.

Figure 10:
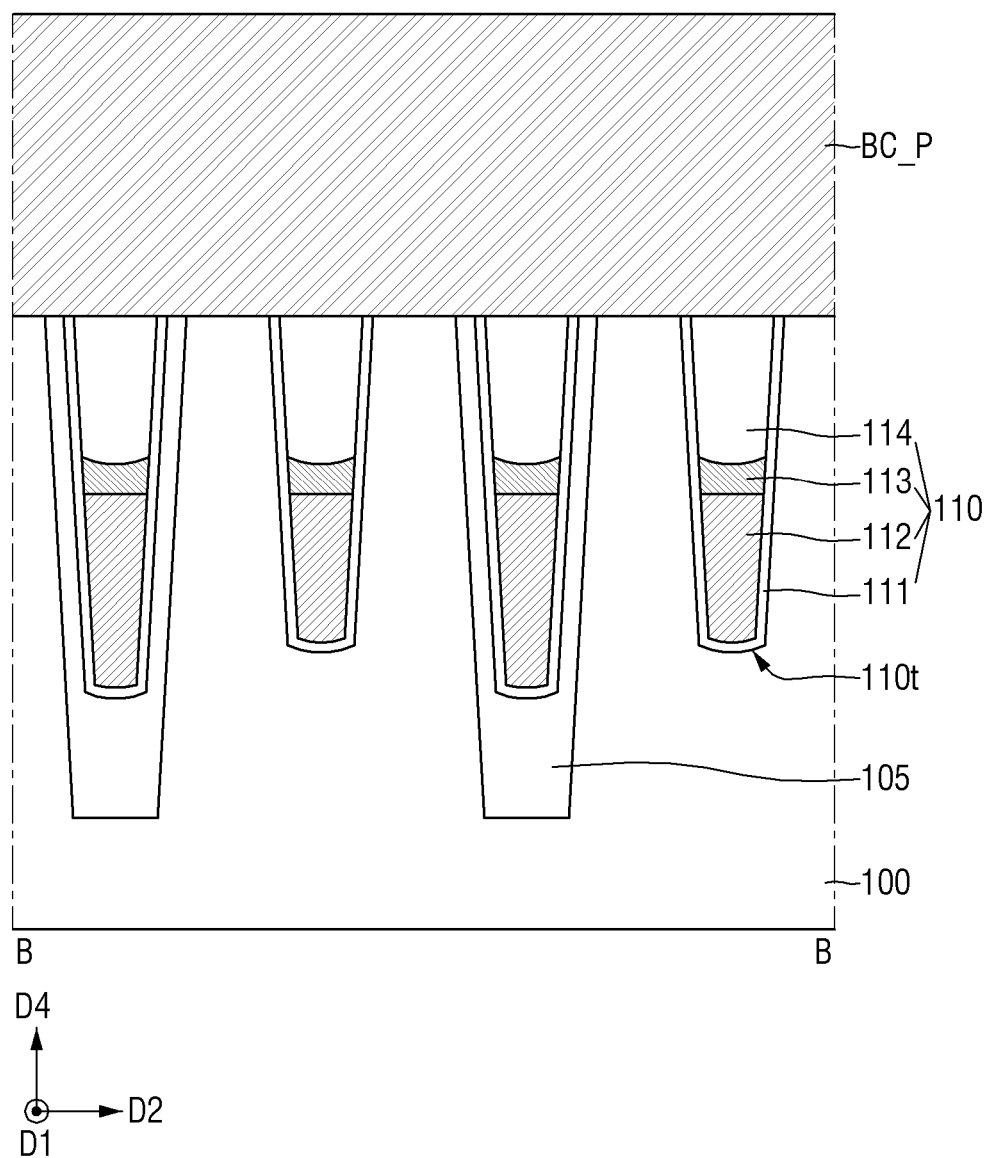
FIGS. 10 to 23 are intermediate stage diagrams for explaining a method for fabricating the semiconductor memory device according to some embodiments.

Referring to FIG. 10, a plurality of element separation films 105 and a plurality of gate structures 110 may be formed inside the substrate 100.

Each of the plurality of gate structures 110 may extend in the first direction D1. The plurality of gate structures 110 may be spaced apart from each other in the second direction D2. A part of the plurality of gate structures 110 may be placed inside the element separation film 105. A part of the plurality of gate structures 110 may be buried inside the substrate 100.

The gate structure 110 may include a gate insulating film 111, a gate electrode 112, a gate capping conductive film 113, and a gate capping pattern 114.

The gate insulating film 111 may be placed along the profile of the gate trench 110*t*. The gate electrode 112 may be placed on the gate insulating film 111. The gate electrode 112 may at least partially or completely fill a part of the gate trench 110*t*. The gate capping conductive film 113 may be placed on the gate electrode 112. The gate capping conductive film 113 may at least partially or completely fill a part of the gate trench 110*t*. The gate capping pattern 114 may be placed on the gate capping conductive film 113. The gate capping pattern 114 may at least partially or completely fill the gate trench 110*t* that remains after the gate electrode 112 and the gate capping conductive film 113 are formed.

Subsequently, a pre buried contact BC_P may be formed on the upper surface of the substrate 100, the upper surface of the element separation film 105, and the upper surface of the gate structure 110. The pre buried contact BC_P may include, for example, at least one of an impurity-doped semiconductor material, a conductive silicide compound, a conductive metal nitride, polysilicon, and/or a metal. The pre buried contact BC_P will be described as polysilicon below.

Figure 11:
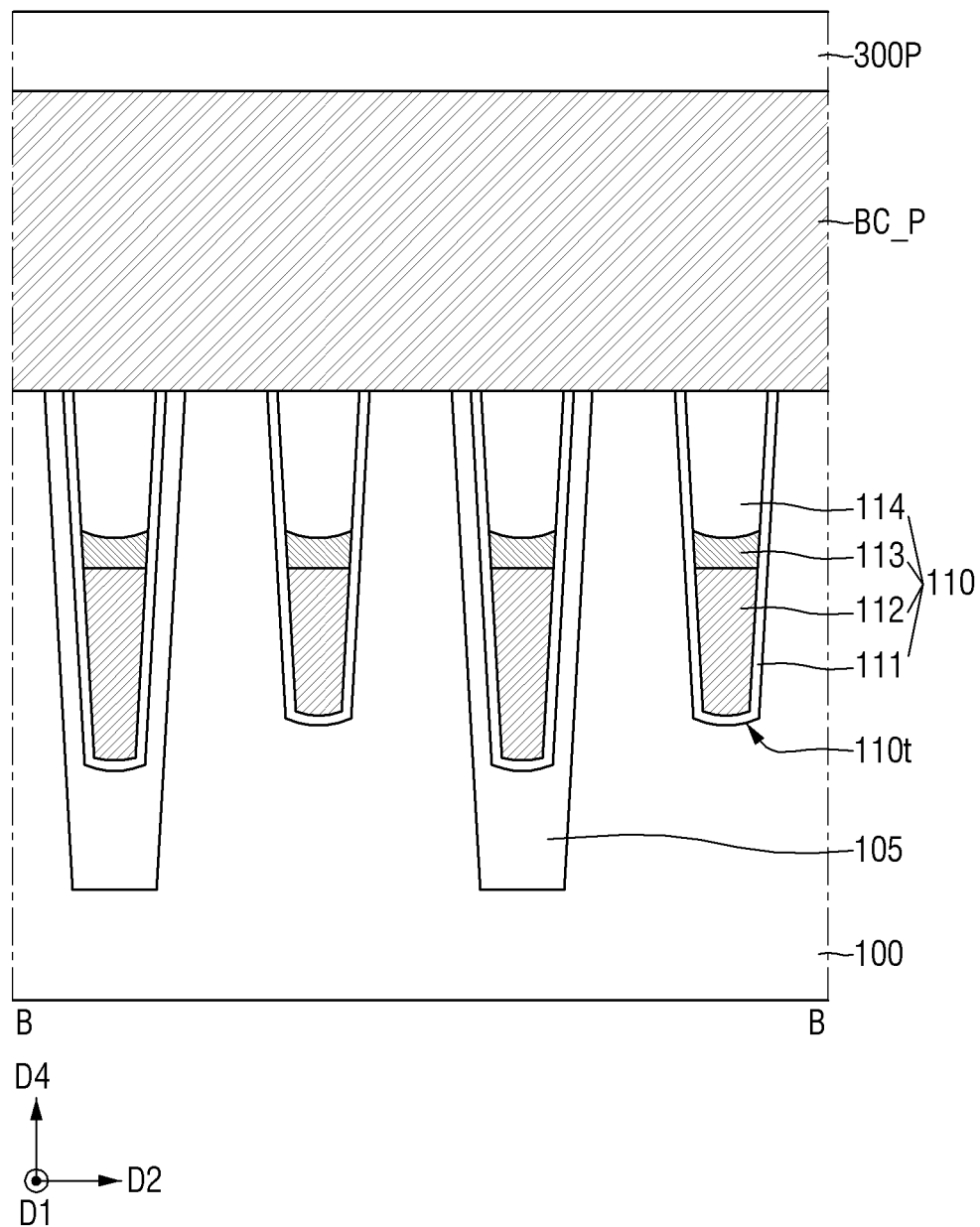

Referring to FIG. 11, a pre mask film 300P may be formed on the pre buried contact BC_P. Although the pre mask film 300P may be, for example, a SOH (spin on hardmask), the technical idea of the present disclosure is not limited thereto.

Figure 12:
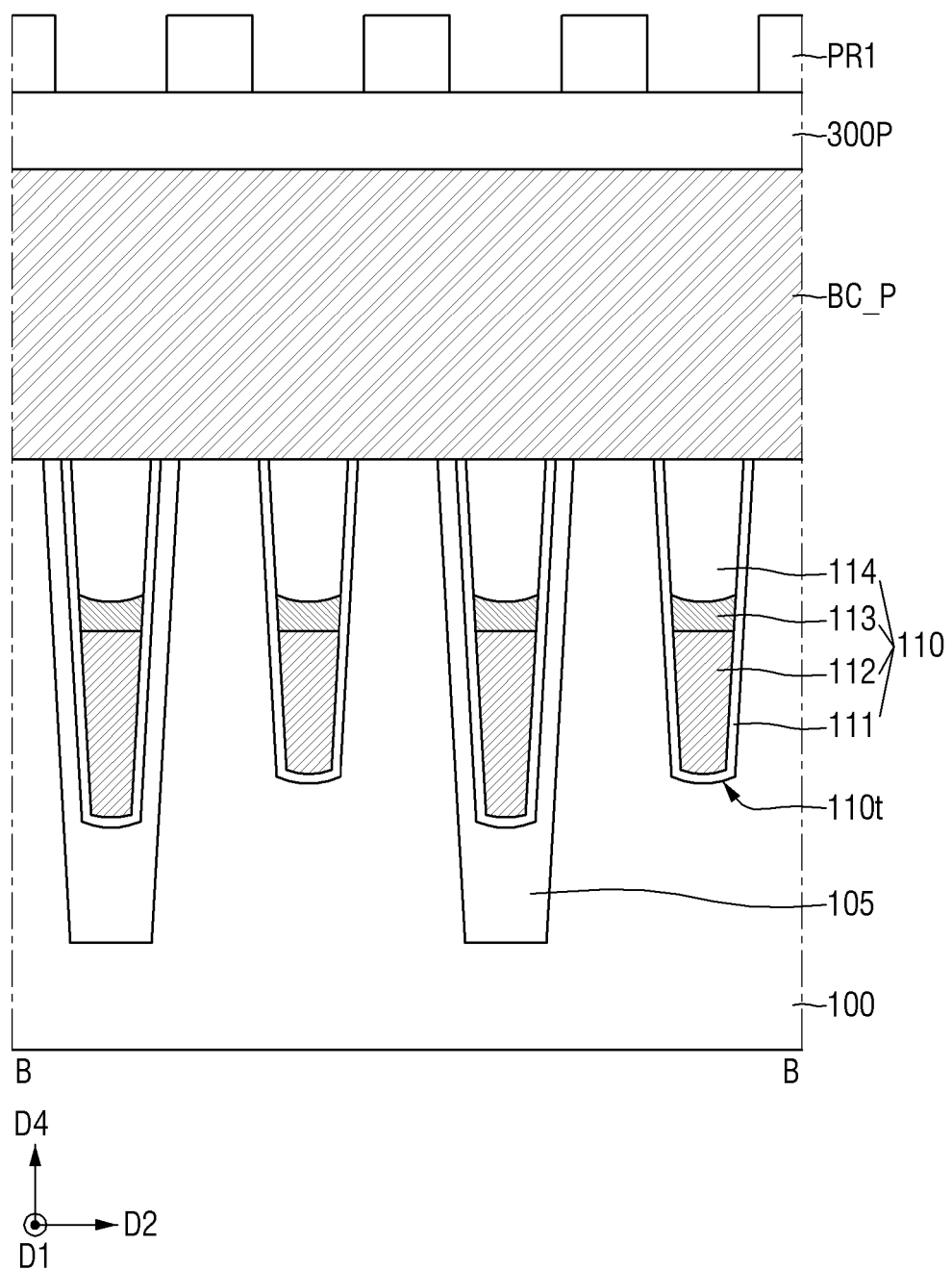

Referring to FIG. 12, a first photoresist PR1 may be formed on the pre mask film 300P.

The first photoresists PR1 may be used to form a fence, which will be described below. An interval between the respective first photoresists PR1 in the second direction D2 may be the same as the width of the fence in the second direction D2. Here, the term "same" may include a process margin.

Figure 13:
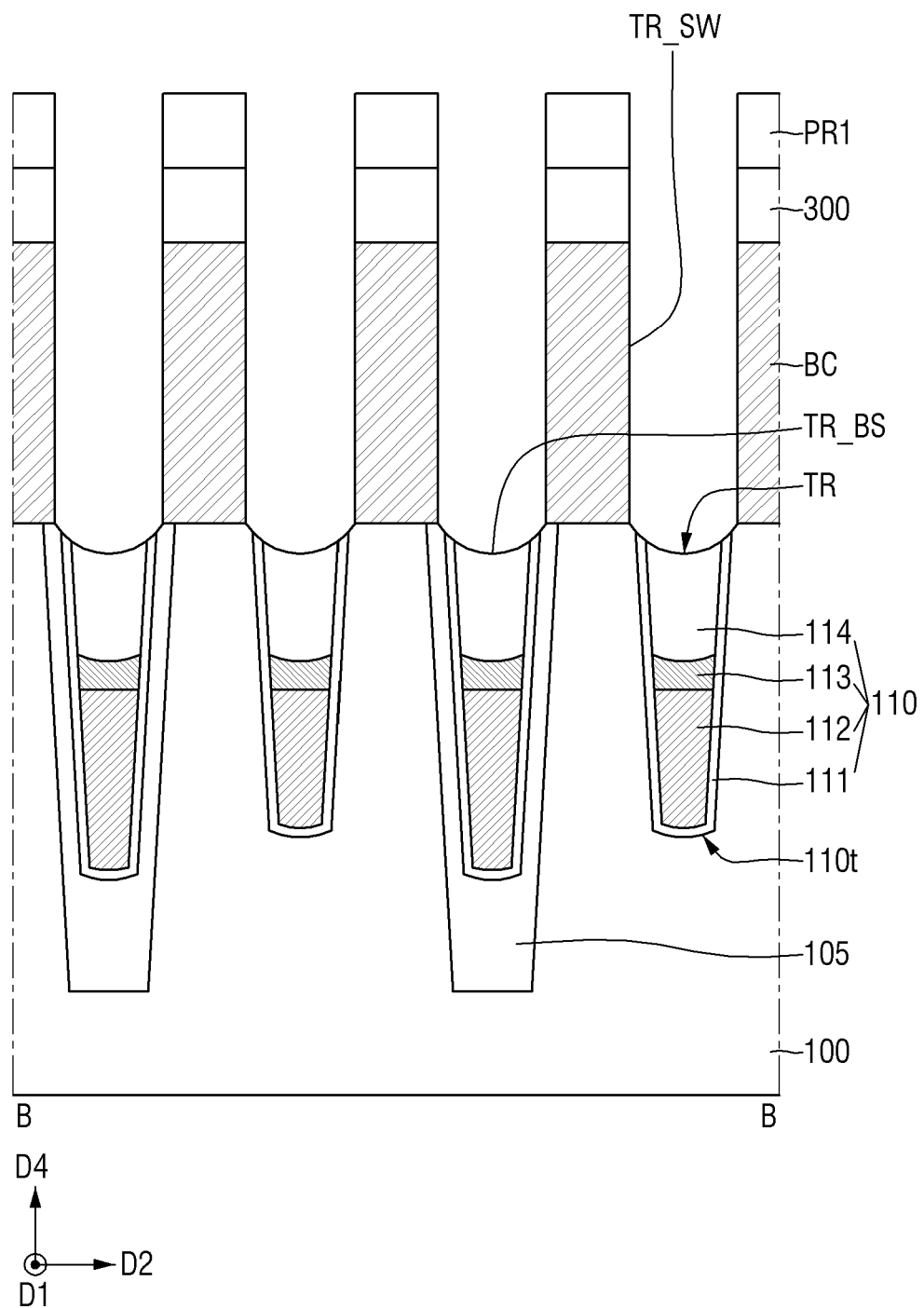

Referring to FIG. 13, the pre mask film 300P and the pre buried contact BC_P may be etched, using a plurality of first photoresists PR1 as masks.

The pre mask film 300P may be etched to form the mask film 300. The pre buried contact BCP may be etched to form a buried contact BC and a trench TR.

The trench TR may be formed between adjacent buried contacts BC. The side walls TR_SW of the trench TR may be the same as the side walls of the buried contact BC. The bottom surface TR_BS of the trench TR may be formed to be lower than the upper surface of the substrate 100. However, the technical idea of the present disclosure is not limited thereto.

Figure 14:
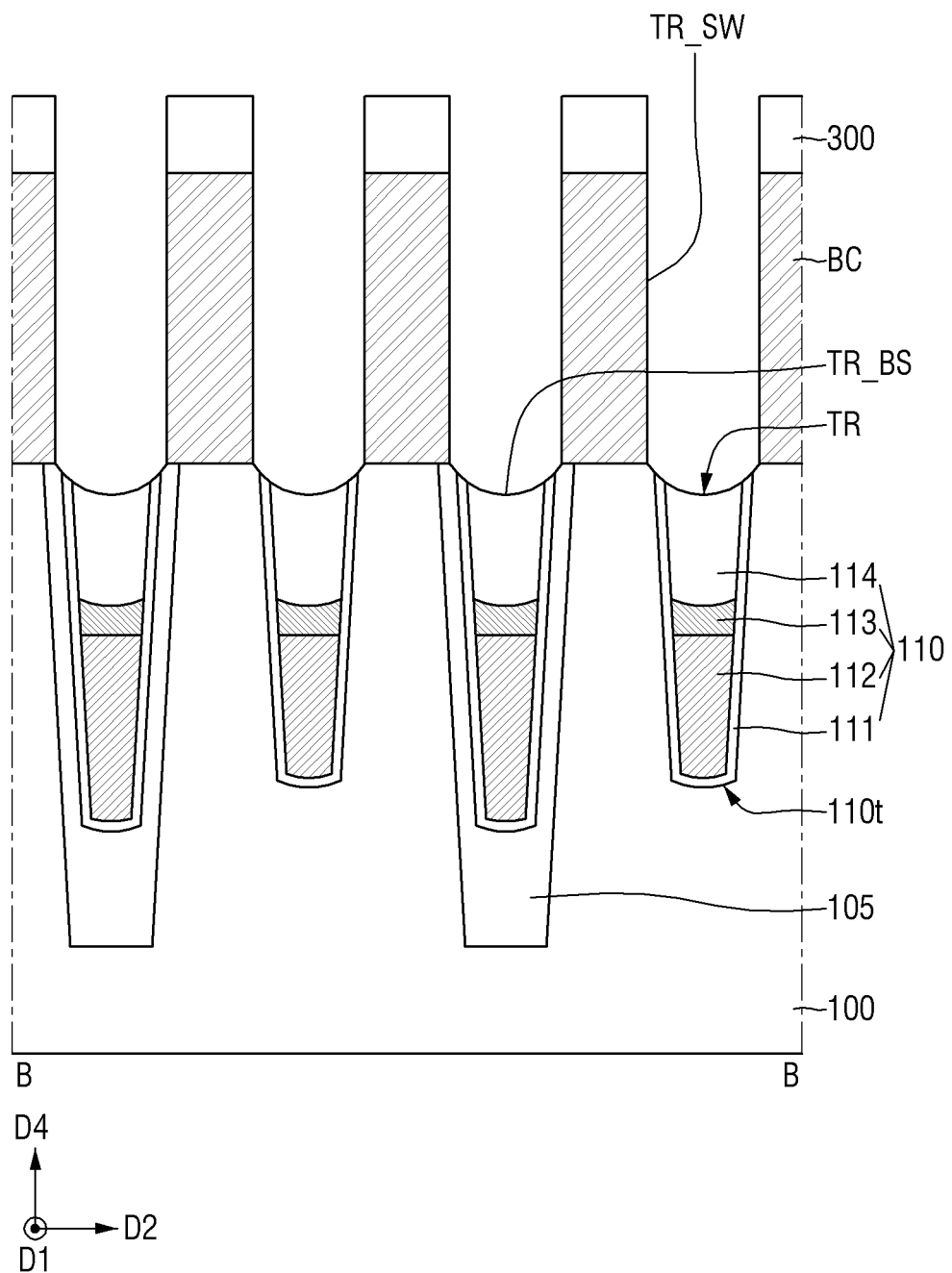

Referring to FIG. 14, the first photoresist PR1 may be removed. The first photoresist PR1 may be removed to expose the upper surface of the mask film 300.

Figure 15:
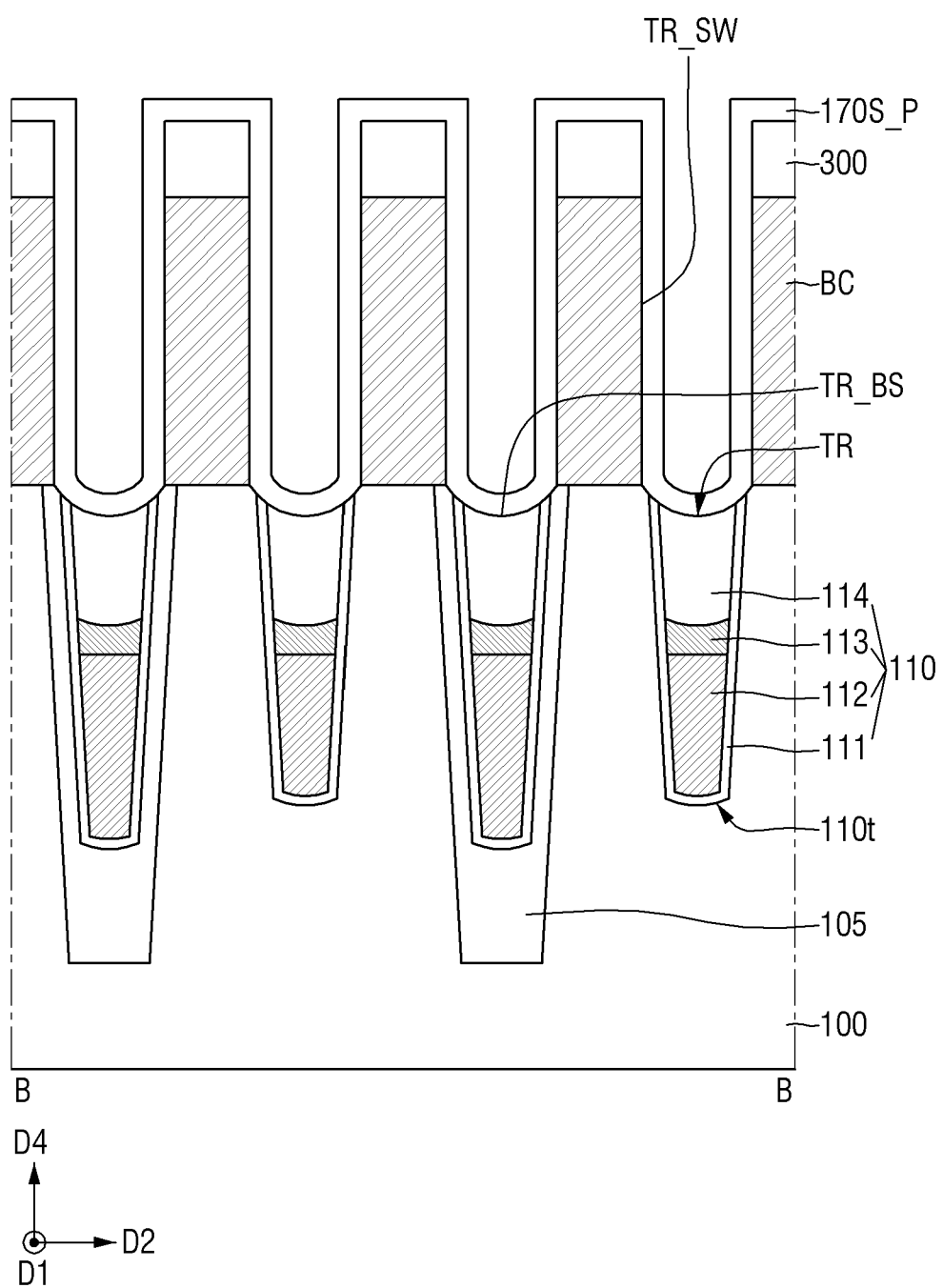

Referring to FIG. 15, a pre spacer film 170S_P may be formed on the substrate 100.

The pre spacer film 170S_P may be conformally formed along the bottom surface TR_BS of the trench TR, the side walls TR_SW of the trench TR, the side walls of the mask film 300, and the upper surface of the mask film 300.

The pre spacer film 170S_P may be formed, but is not limited to, for example, using an atomic layer deposition (ALD) process. The pre spacer film 170S_P may include a low dielectric constant material. The pre spacer film 170S_P may include, but is not limited to, for example, at least one of silicon oxide ($SiO_2$) or a low dielectric constant material having a dielectric constant lower than that of silicon nitride.

Figure 16:
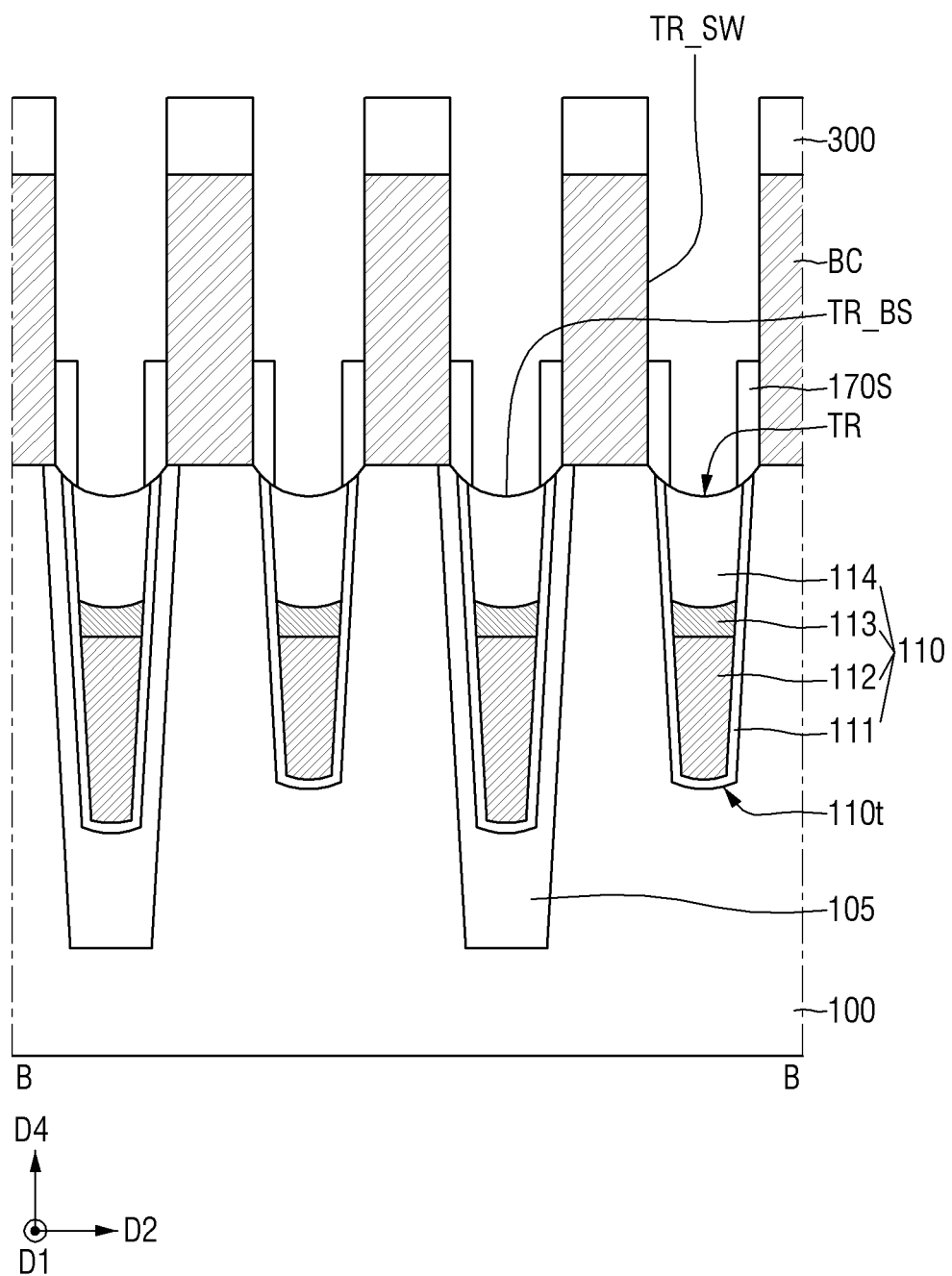

Referring to FIG. 16, a part of the pre spacer film 170S_P may be removed to form the spacer film 170S.

The pre spacer film 170S_P may be etched to expose a part of the bottom surface TR_BS of the trench TR, a part of the side walls TR_SW of the trench TR, the upper surface of the mask film 300 and the side walls of the mask film 300. A pair of spacer films 170S in the trench TR may be spaced apart from each other in the second direction D2. The pair of spacer films 170S in the trench TR may not extend along the bottom surface TR_BS of the trench TR.

Figure 17:
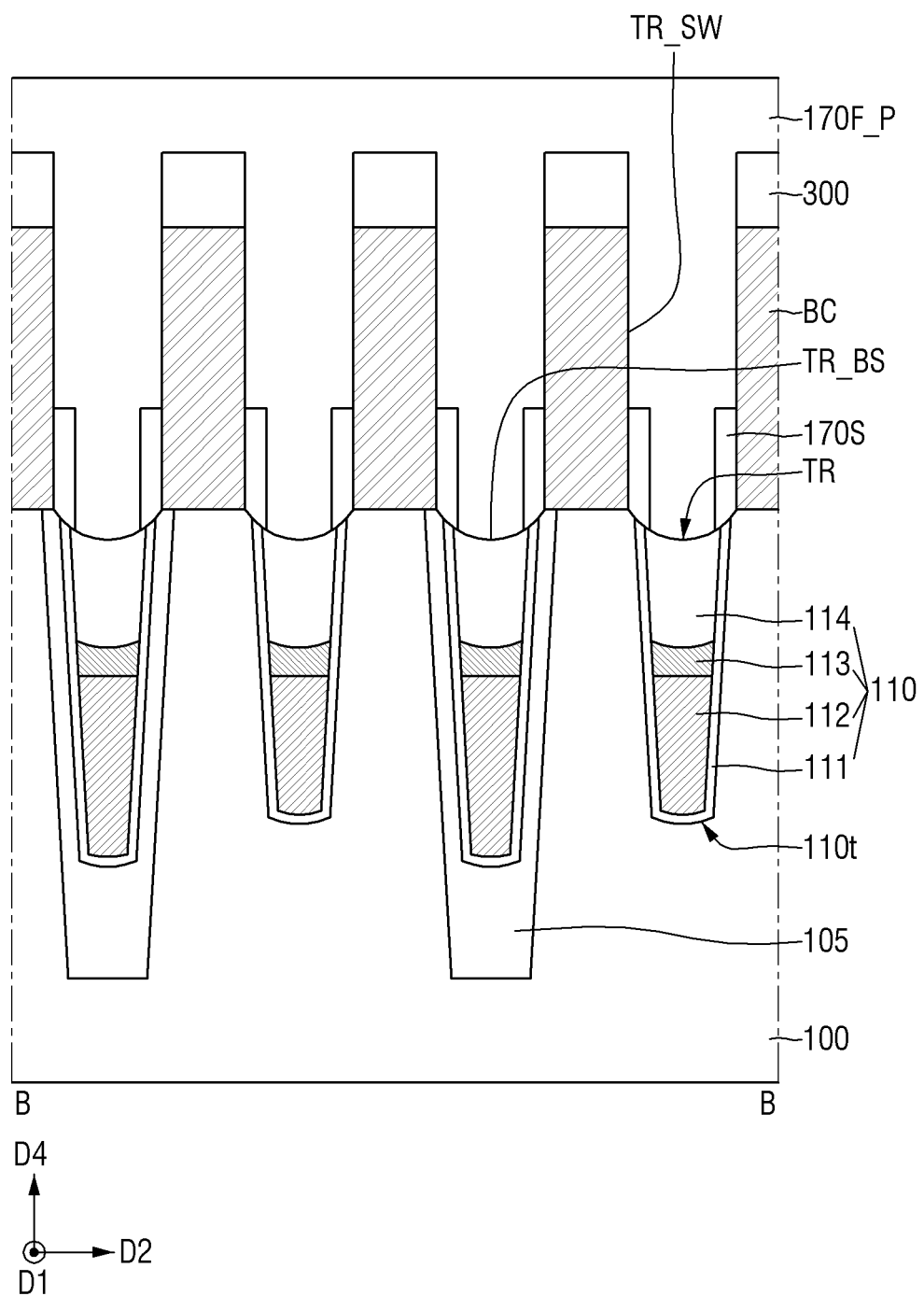

Referring to FIG. 17, a pre filling film 170F_P may be formed on the substrate 100, the element separation film 105 and the gate structure 110.

The pre filling film 170F_P may fill the trench TR that remains after the spacer film 170S is formed. The pre filling film 170F_P may completely cover or overlap the spacer film 170S and the mask film 300. The pre filling film 170F may include a material having a higher dielectric constant than that of the spacer film 170S. Although the pre filling film 170F may include, for example, at least one of silicon nitride, silicon oxynitride, or a high dielectric constant material having a higher dielectric constant than that of silicon oxide, the technical ideas of the present disclosure are not limited thereto.

Figure 18:
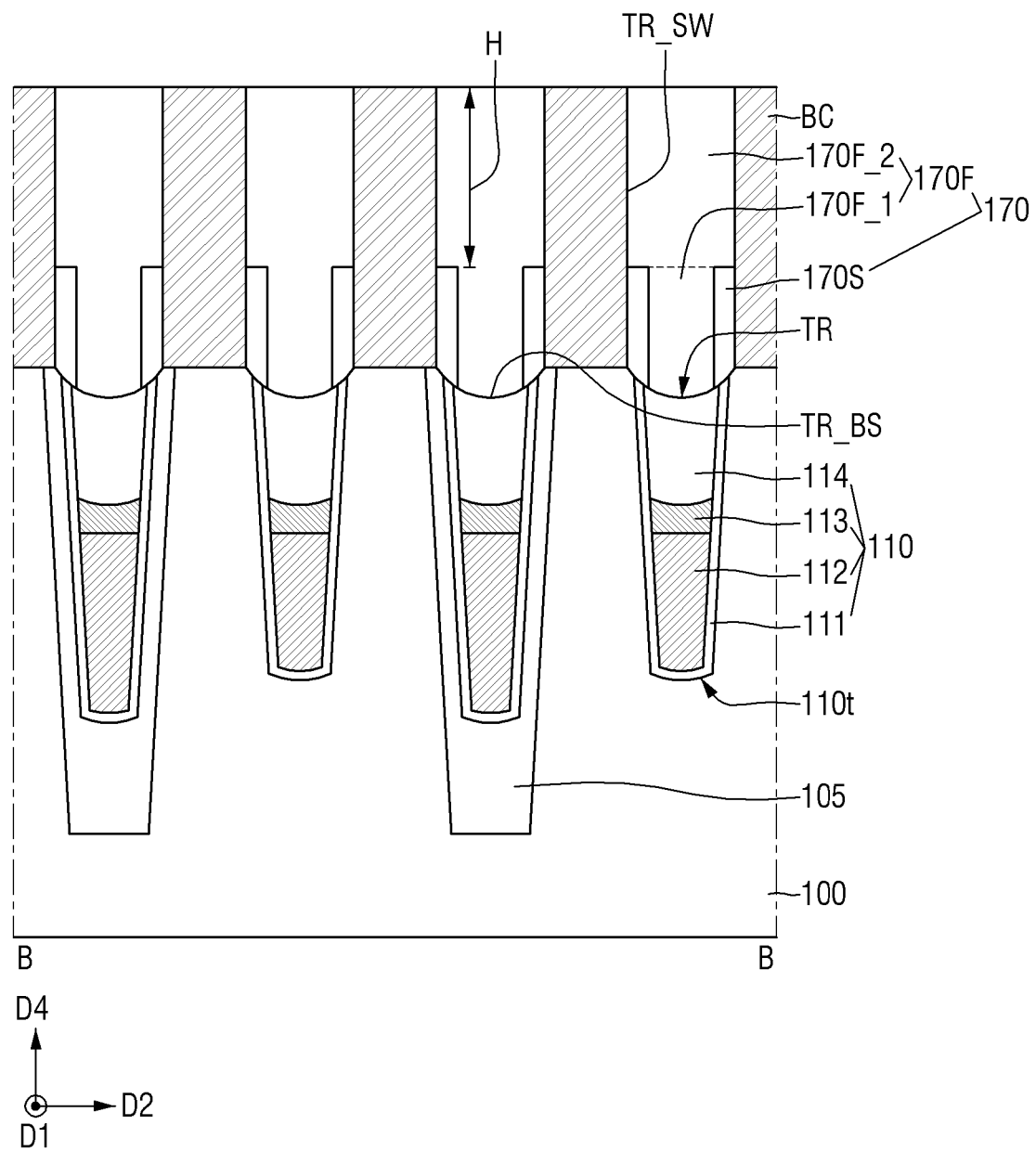

Referring to FIG. 18, the pre filling film 170F_P and the mask film 300 may be removed to form a filling film 170F.

The mask film 300 may be removed to expose the buried contact BC. A height H from the upper surface of the filling film 170F to the upper surface of the spacer film 170S may be 5 nm to 100 nm. However, the technical idea of the present disclosure is not limited thereto.

Figure 19:
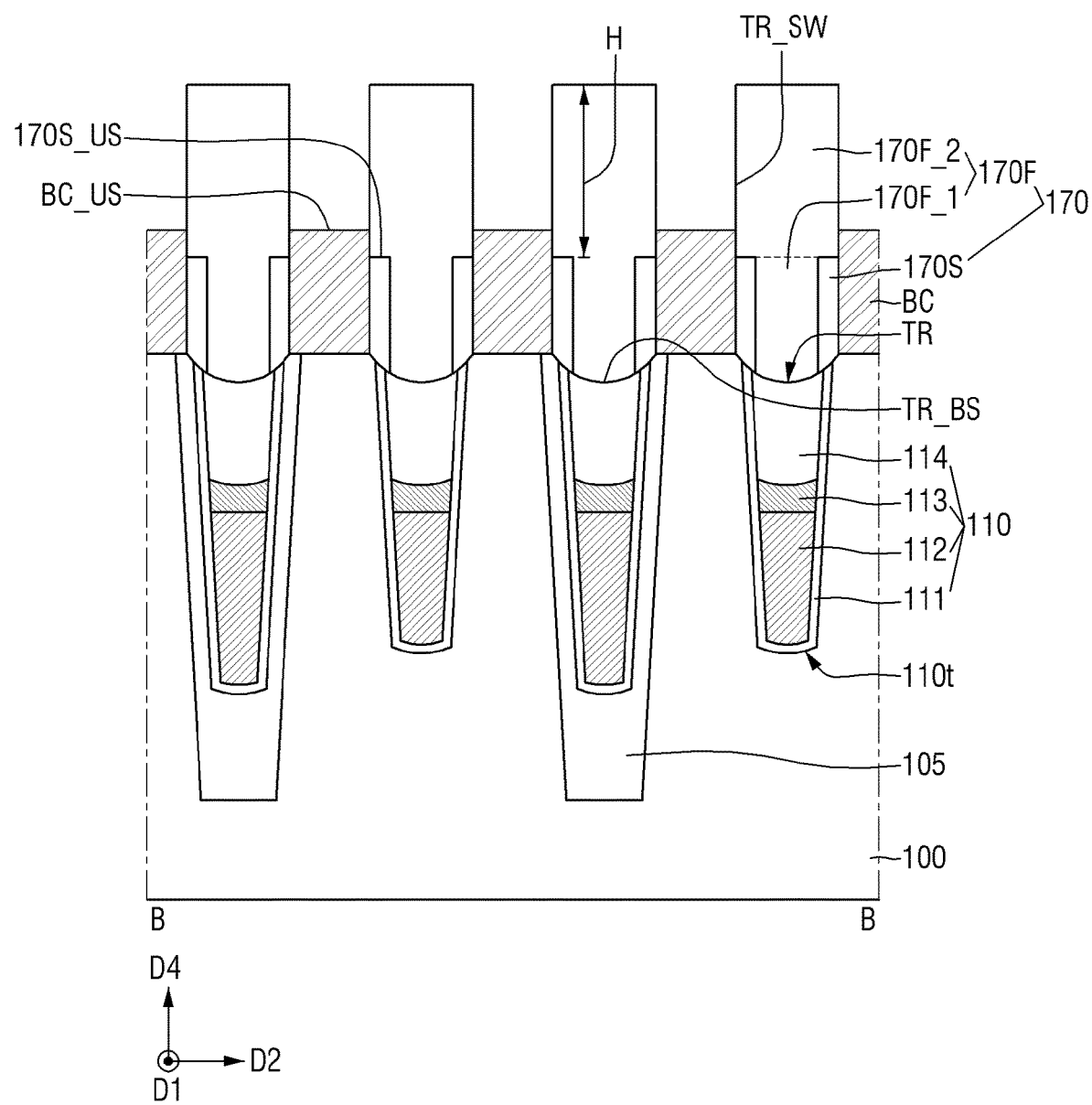

Referring to FIG. 19, a part of the buried contact BC may be etched. Since the etching selectivity of the buried contact BC and the filling film 170F differ from each other, only the buried contact BC may be selectively etched.

The upper surface BC_US of the buried contact BC may be higher than the upper surface 170S_US of the spacer film 170S. However, the technical idea of the present disclosure is not limited thereto, and the upper surface BC_US of the buried contact BC may, of course, be lower than the upper surface 170S_US of the spacer film 170S.

Figure 20:
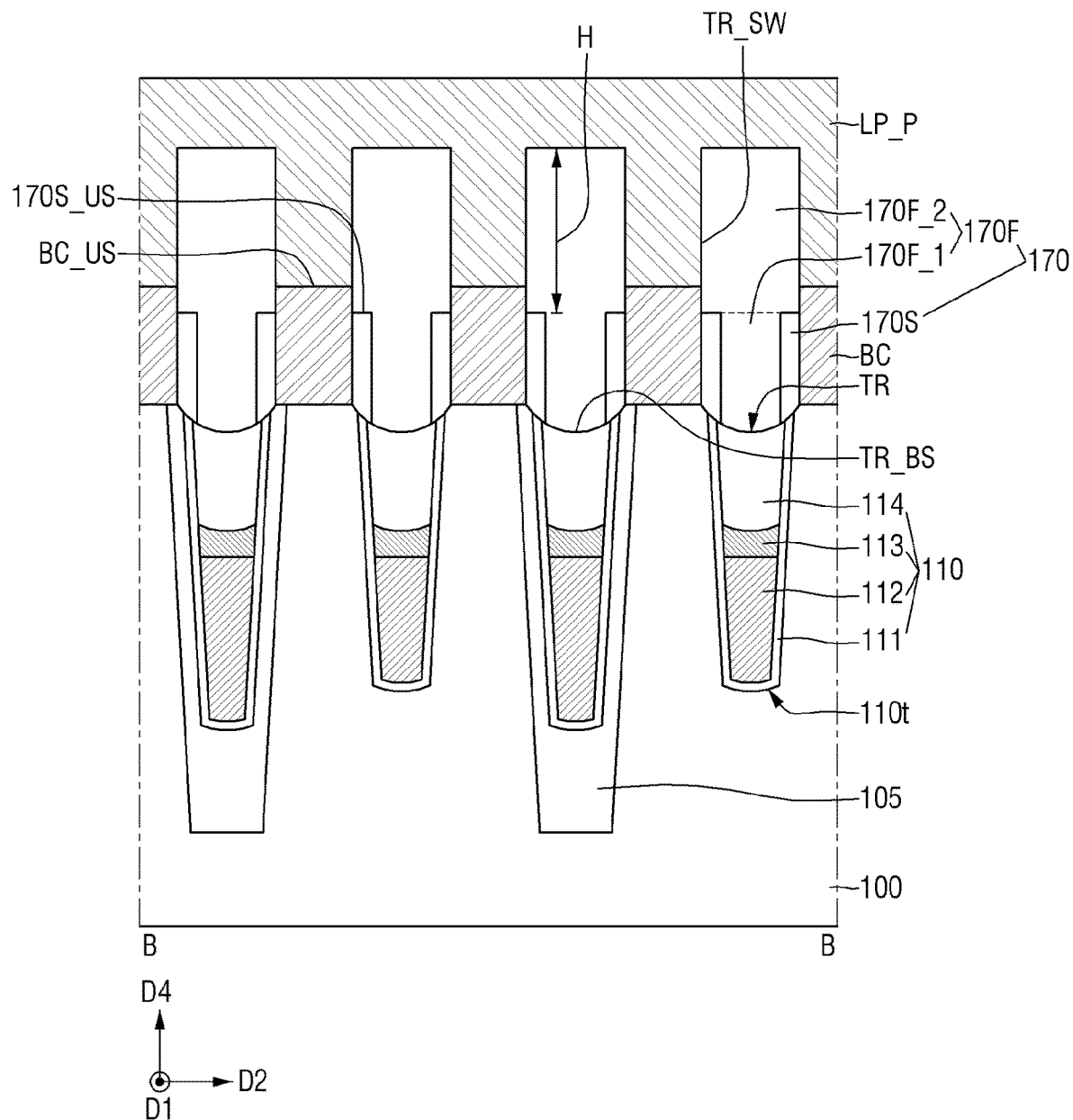

Referring to FIG. 20, a pre landing pad LP_P may be formed on the buried contact BC and the filling film 170F.

The pre landing pad LP_P may completely cover or overlap the upper surface BC_US of the buried contact BC and the filling film 170F. The pre landing pad LP_P may include, for example, at least one of an impurity-doped semiconductor material, a conductive silicide compound, a conductive metal nitride, a conductive metal carbide, a metal, and/or a metal alloy.

Figure 21:
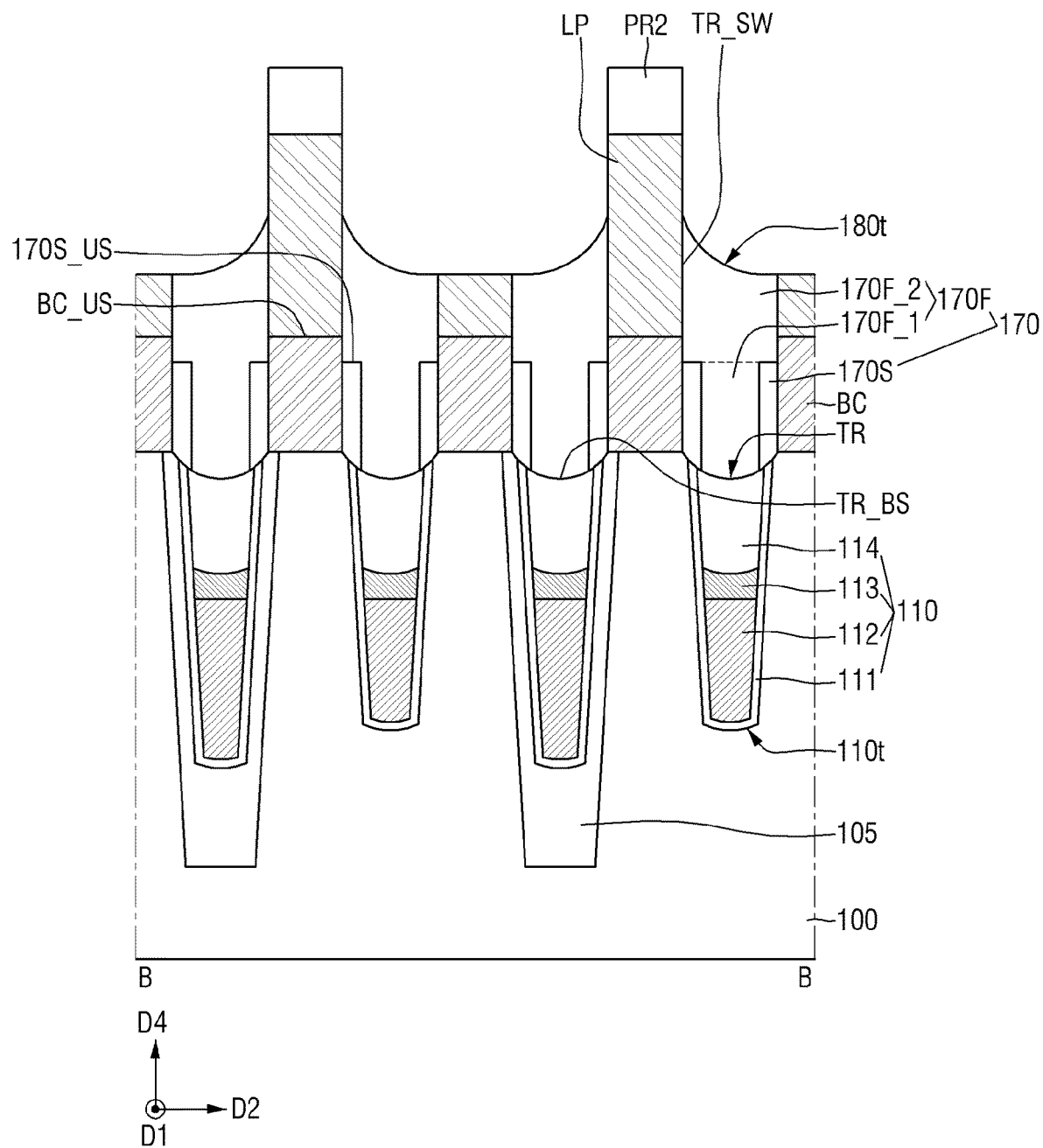

Referring to FIG. 21, a second photoresist PR2 may be formed on the buried contact BC. The second photoresist PR2 may include a portion that overlaps the buried contact BC in the fourth direction D4.

Subsequently, a part of the pre landing pad LP_P and a part of the filling film 170F may be removed, using the second photoresist PR2 as a mask. A part of the pre landing pad LP_P and a part of the filling film 170F may be removed to form an interlayer insulating film trench 180t.

A part of the pre landing pad LP_P may be removed to form the landing pad LP.

Figure 22:
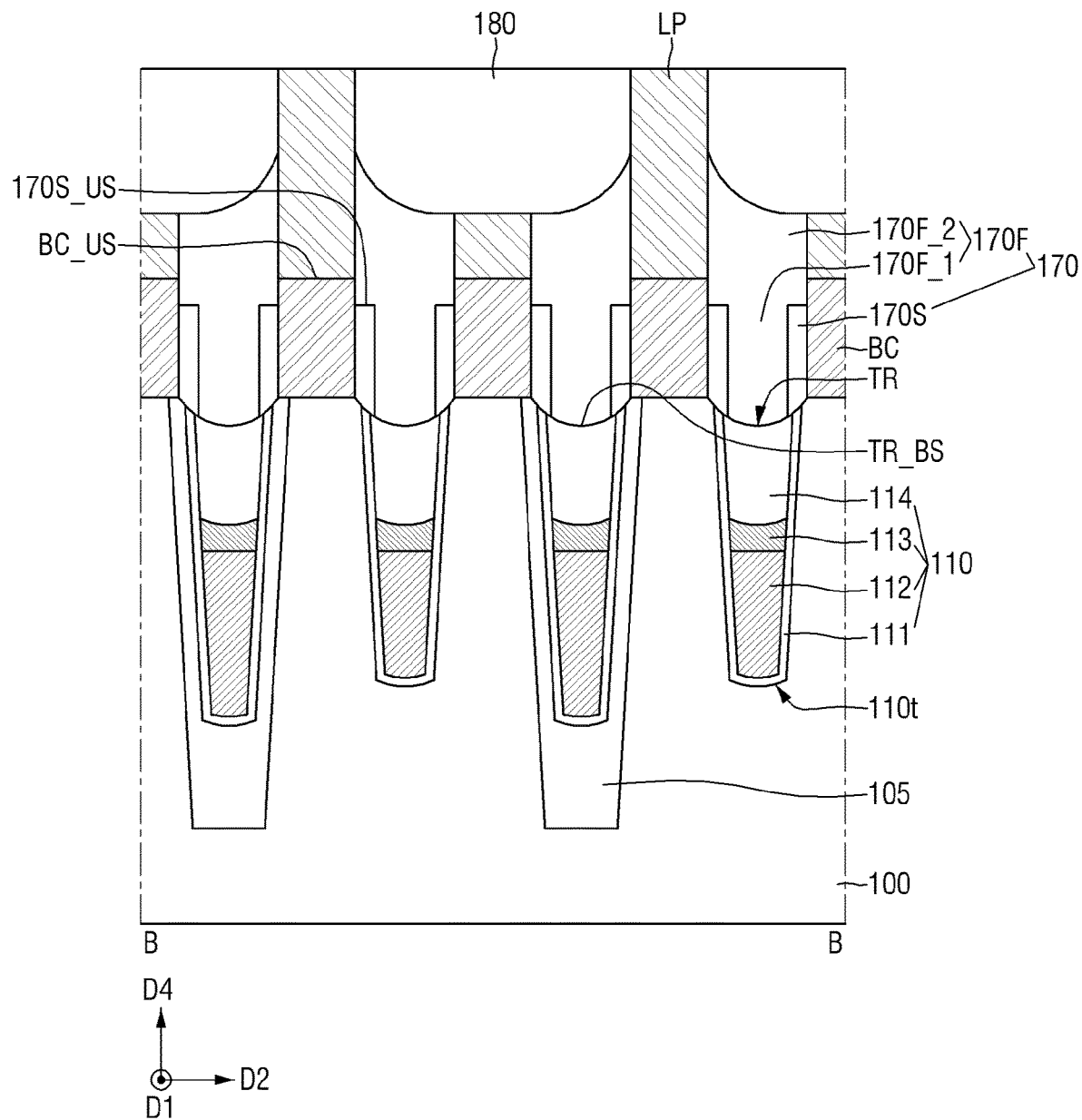

Referring to FIG. 22, an interlayer insulating film 180 that at least partially fills the interlayer insulating film trench 180t may be formed.

Although it is not shown, a pre interlayer insulating film that at least partially fills the interlayer insulating film trench 180t and covers or overlaps the second photoresist may be formed. Subsequently, the second photoresist and the pre interlayer insulating film are removed to form the interlayer insulating film 180.

Figure 23:
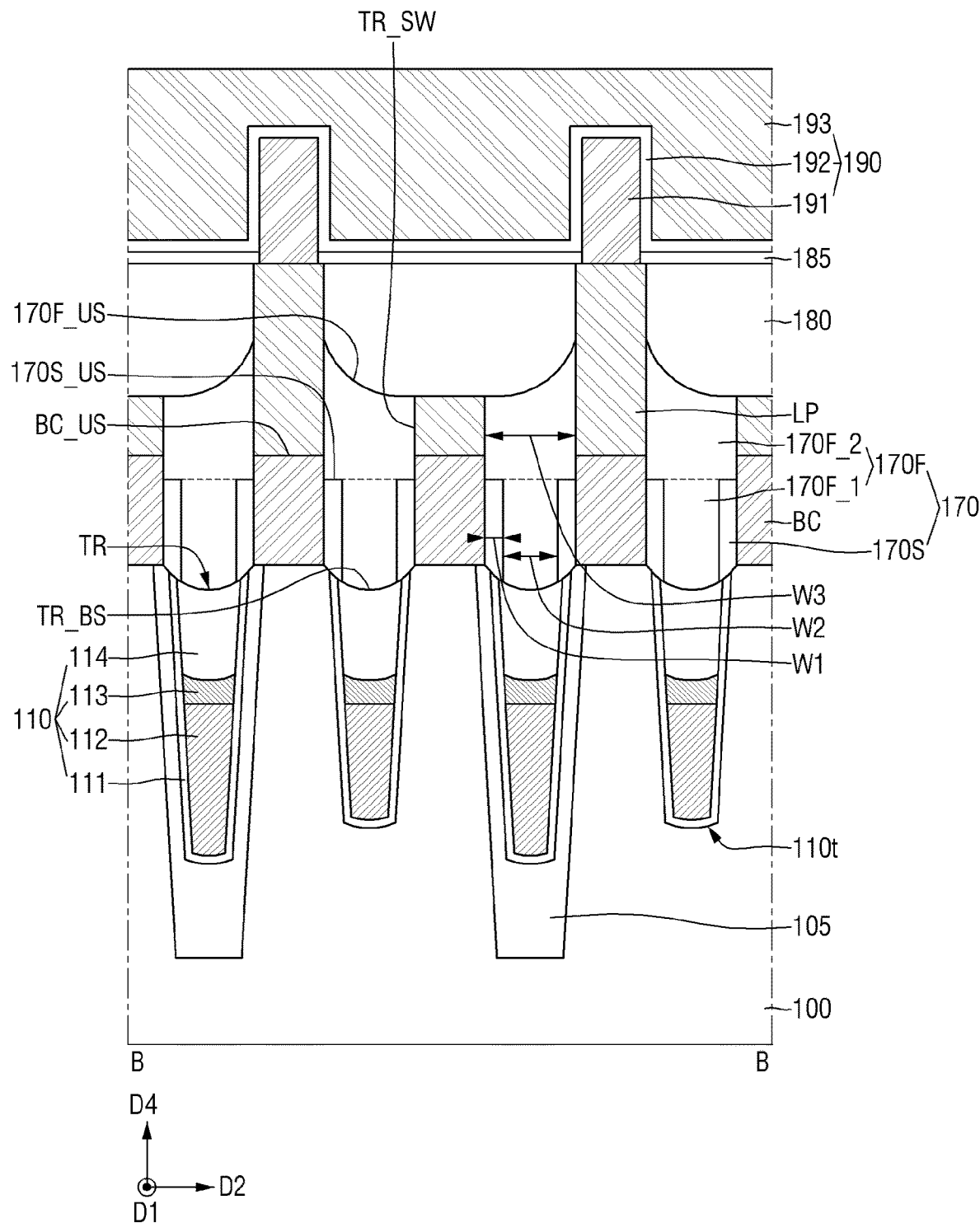

Referring to FIG. 23, the etching stop film 185 and the capacitor 190 may be formed on the interlayer insulating film 180 and the landing pad LP.

In concluding the detailed description, those skilled in the art will appreciate that many variations and modifications may be made to the preferred embodiments without substantially departing from the principles of the present disclosure. Therefore, the disclosed preferred embodiments of the disclosure are used in a generic and descriptive sense only and not for purposes of limitation.

What is claimed is:

1. A semiconductor memory device comprising:
   a substrate;
   a gate electrode extending in a first direction in the substrate;
   a gate capping pattern on the gate electrode:
   a plurality of buried contacts on the substrate;
   a trench between adjacent ones of the buried contacts; and
   a fence in the trench, wherein the fence is on the gate electrode,
   wherein a bottom surface of the trench is defined by a top surface of the gate capping pattern,
   wherein the fence comprises a spacer film on side walls of the trench and extending in a second direction intersecting the first direction, and a filling film in the trench and on the spacer film,
   wherein an upper surface of the spacer film is lower than an upper surface of the filling film with respect to the substrate, and
   wherein the spacer film does not extend along the bottom surface of the trench.

2. The semiconductor memory device of claim 1, further comprising:
   a landing pad,
   wherein at least a portion of the filling film overlaps the spacer film in the second direction, and
   wherein the filling film is in contact with the spacer film, at least two of the plurality of buried contacts, and the landing pad.

3. The semiconductor memory device of claim 1, wherein a width of the spacer film in a third direction intersecting the first direction and the second direction is 0.5 nm to 10 nm.

4. The semiconductor memory device of claim 1, wherein the upper surface of the spacer film is lower than an upper surface of a first buried contact of the plurality of buried contacts, with respect to the substrate.

5. The semiconductor memory device of claim 1, wherein the spacer film is in contact with side walls of a first buried contact of the plurality of buried contacts.

6. The semiconductor memory device of claim 1, wherein the fence comprises a seam spaced apart from the spacer film in a third direction intersecting the first direction and the second direction.

7. The semiconductor memory device of claim 1, wherein the spacer film comprises a first material having a first dielectric constant that is lower than a second dielectric constant of a second material of the filling film.

8. The semiconductor memory device of claim 1, wherein the filling film comprises silicon nitride.

9. A semiconductor memory device comprising:
   a substrate;
   a gate electrode extending in a first direction in the substrate;
   a gate capping pattern on the gate electrode:
   a plurality of buried contacts on the substrate; and
   a fence in a trench between adjacent ones of the buried contacts, wherein the fence is on the gate electrode,
   wherein a bottom surface of the trench is defined by a top surface of the gate capping pattern,
   wherein the fence comprises a spacer film on side walls of the trench and extending in a second direction intersecting the first direction, and a filling film in the trench and on the spacer film,
   wherein the filling film comprises a first portion having a first width in a third direction intersecting the first direction and the second direction, and a second portion having a second width in the third direction,
   wherein the second portion is on the first portion,
   wherein the second width is greater than the first width,
   wherein the second portion of the filling film at least partially overlaps the spacer film in the second direction, and
   wherein the spacer film does not extend along the bottom surface of the trench.

10. The semiconductor memory device of claim 9, wherein the first portion of the filling film at least partially overlaps side walls of the spacer film in the third direction.

11. The semiconductor memory device of claim 9, wherein an upper surface of the spacer film is lower than the upper surface of a first one of the plurality of buried contacts, with respect to the substrate, and
   wherein the spacer film does not overlap at least a portion of gate electrode in the second direction.

12. The semiconductor memory device of claim 9, further comprising:
   a landing pad on a first buried contact of the plurality of buried contacts; and
   a lower electrode of a capacitor,
   wherein the lower electrode of the capacitor is in contact with the landing pad,
   wherein a width of the landing pad is substantially same as a width of the first buried contact, and
   wherein a width of the lower electrode of the capacitor is less than the width of the landing pad and the width of the first buried contact.

13. The semiconductor memory device of claim 9, wherein the fence comprises a seam spaced apart from the spacer film in the third direction.

14. The semiconductor memory device of claim 9, wherein the spacer film comprises a first material having a first dielectric constant that is lower than a second dielectric constant of a second material of the filling film.

15. The semiconductor memory device of claim 9, wherein the filling film comprises silicon nitride.

16. The semiconductor memory device of claim 9, wherein a ratio of a width of the trench in the third direction to the first width of the first portion of the filling film is 0.5 or less.

17. A semiconductor memory device comprising:
- a substrate;
- a gate structure comprising a gate electrode extending in a first direction and a gate capping pattern on the gate electrode, wherein the gate structure extends in the substrate;
- a plurality of buried contacts on the substrate; and
- a fence in a trench between adjacent ones of the plurality of buried contacts, wherein the fence is on the gate electrode,
- wherein a bottom surface of the trench is defined by a top surface of the gate capping pattern,
- wherein the fence comprises a pair of spacer films on respective side walls of the trench and extending in a second direction intersecting the first direction, and a filling film in the trench and on the pair of spacer films,
- wherein the filling film comprises a first portion having a first width in a third direction intersecting the first direction and the second direction, and a second portion having a second width in the third direction,
- wherein the second portion is on the first portion,
- wherein the second width is greater than the first width,
- wherein an upper surface of one of the pair of spacer films is lower than an upper surface of the second portion of the filling film with respect to the substrate,
- wherein the pair of spacer films are separated from one another in the first direction, and
- wherein the pair of spacer films do not extend along the bottom surface of the trench.

18. The semiconductor memory device of claim 17, wherein the filling film comprises silicon nitride, and wherein the pair of spacer films comprises a first material having a dielectric constant that is lower than a dielectric constant of the silicon nitride of the filling film.

* * * * *